United States Patent
Yamazaki et al.

(10) Patent No.: US 9,716,182 B2
(45) Date of Patent: Jul. 25, 2017

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Daisuke Matsubayashi, Kanagawa (JP); Hiroyuki Miyake, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/823,044

(22) Filed: Aug. 11, 2015

(65) Prior Publication Data

US 2015/0349135 A1 Dec. 3, 2015

Related U.S. Application Data

(63) Continuation of application No. 14/079,898, filed on Nov. 14, 2013, now Pat. No. 9,159,838.

(30) Foreign Application Priority Data

Nov. 16, 2012 (JP) ................................. 2012-251935

(51) Int. Cl.
*H01L 29/00* (2006.01)
*H01L 29/786* (2006.01)
(Continued)

(52) U.S. Cl.
CPC ........ *H01L 29/7869* (2013.01); *H01L 29/045* (2013.01); *H01L 29/24* (2013.01);
(Continued)

(58) Field of Classification Search
CPC ... H01L 29/7869; H01L 29/24; H01L 29/045; H01L 29/42384; H01L 29/78627;
(Continued)

(56) References Cited

U.S. PATENT DOCUMENTS 5,079,606 A 1/1992 Yamamura et al.
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Fortunato E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Nikolay Yushin
(74) *Attorney, Agent, or Firm* — Nixon Peabody LLP; Jeffrey L. Costellia

(57) ABSTRACT

A highly reliable semiconductor device is provided. The semiconductor device includes a gate electrode, a gate insulating film over the gate electrode, a semiconductor film overlapping with the gate electrode with the gate insulating film positioned therebetween, a source electrode and a drain electrode that are in contact with the semiconductor film, and an oxide film over the semiconductor film, the source electrode, and the drain electrode. An end portion of the semiconductor film is spaced from an end portion of the source electrode or the drain electrode in a region overlapping with the semiconductor film in a channel width direction. The semiconductor film and the oxide film each include a metal oxide including In, Ga, and Zn. The oxide film has an atomic ratio where the atomic percent of In is lower than the atomic percent of In in the atomic ratio of the semiconductor film.

24 Claims, 18 Drawing Sheets

(51) Int. Cl.
  *H01L 29/24*      (2006.01)
  *H01L 29/04*      (2006.01)
  *H01L 29/423*     (2006.01)
  *H01L 29/51*      (2006.01)
  *H01L 29/417*     (2006.01)

(52) U.S. Cl.
  CPC .. *H01L 29/41733* (2013.01); *H01L 29/42356* (2013.01); *H01L 29/42384* (2013.01); *H01L 29/513* (2013.01); *H01L 29/518* (2013.01); *H01L 29/78627* (2013.01); *H01L 29/78696* (2013.01)

(58) Field of Classification Search
  CPC ............ H01L 29/78696; H01L 29/513; H01L 29/518; H01L 29/41733; H01L 29/42356
  See application file for complete search history.

(56) References Cited

U.S. PATENT DOCUMENTS

| | | | |
|---|---|---|---|
| 5,744,864 A | 4/1998 | Cillessen et al. | |
| 6,160,600 A | 12/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,897,482 B2 | 5/2005 | Morita et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,550,764 B2 * | 6/2009 | Jang | G02F 1/136286 257/40 |
| 7,674,650 B2 | 3/2010 | Akimoto et al. | |
| 7,732,819 B2 | 6/2010 | Akimoto et al. | |
| 7,741,643 B2 | 6/2010 | Miyazaki et al. | |
| 7,932,888 B2 | 4/2011 | Miyake | |
| 8,442,183 B2 | 5/2013 | Amano et al. | |
| 8,502,221 B2 | 8/2013 | Yamazaki | |
| 8,530,892 B2 | 9/2013 | Yamazaki et al. | |
| 8,765,522 B2 | 7/2014 | Yamazaki | |
| 8,809,928 B2 * | 8/2014 | Sakata | H01L 27/1156 257/289 |
| 8,932,903 B2 | 1/2015 | Sato et al. | |
| 8,952,381 B2 | 2/2015 | Yamazaki | |
| 8,999,773 B2 | 4/2015 | Hanaoka et al. | |
| 9,048,323 B2 | 6/2015 | Yamazaki et al. | |
| 9,184,297 B2 | 11/2015 | Koezuka et al. | |
| 9,318,613 B2 | 4/2016 | Yamazaki | |
| 9,548,393 B2 | 1/2017 | Koezuka et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0031964 A1 | 2/2004 | Morita et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0157136 A1 | 7/2008 | Matsumoto et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0237600 A1 | 10/2008 | Miyazaki et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0236596 A1 | 9/2009 | Itai | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0108834 A1 | 5/2011 | Yamazaki et al. | |
| 2011/0127579 A1 | 6/2011 | Yamazaki | |
| 2011/0248266 A1 | 10/2011 | Miyake et al. | |
| 2012/0280225 A1 * | 11/2012 | Sakata | H01L 27/1156 257/43 |
| 2014/0014947 A1 | 1/2014 | Yamazaki | |
| 2015/0111340 A1 | 4/2015 | Sato et al. | |
| 2015/0123127 A1 | 5/2015 | Yamazaki | |
| 2015/0214041 A1 | 7/2015 | Hanaoka et al. | |
| 2015/0280003 A1 | 10/2015 | Yamazaki et al. | |
| 2016/0225908 A1 | 8/2016 | Yamazaki | |

(56) References Cited

U.S. PATENT DOCUMENTS

FOREIGN PATENT DOCUMENTS

| JP | 60-198861 A | 10/1985 |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-183165 A | 7/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura K et al., "Room-Temperature Fabrication of Transparent Flexible Thin-Film Transistors Using Amorphous Oxide Semiconductors", Nature, Nov. 25, 2004, vol. 432, pp. 488-492.

Park J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa Y et al., "UHF RFCPUS on Flexible and Glass Substrates for Secure RFID Systems", Journal of Solid-State Circuits , 2008. vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata J et al., "Development of 4.0-In. AMOLED Display With Driver Circuit Using Amorphous In-Ga-Zn-Oxide TFTS", IDW '09 : Proceedings of the 16th International Display Workshops, 2009, pp. 689-692.

(56) References Cited

OTHER PUBLICATIONS

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada T et al , "Development of Driver-Integrated Panel Using Amorphous In-Ga-Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Ohara H et al., "21.3:4.0 In. QVGA AMOLED Display Using In-Ga-Zn-Oxide TFTS With a Novel Passivation Layer", SID Digest '09 : SID International Symposium Digest of Technical Papers, May 31, 2009, pp. 284-287.
Miyasaka M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M. "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom S et al., "Theory of the Blue Phase of Cholesteric Liquid Crystals", Phys. Rev. Lett. (Physical Review Letters), May 4, 1981, vol. 46, No. 18, pp. 1216-1219.
Park Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev B (Physical Review. B), Jan. 15, 2000, vol. 61, No. 3, pp. 1811-1816.
Nomura K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park J et al., "Dry etching of ZnO films and plasma-induced damage to optical properties", J. Vac. Sci. Technol. B(Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl Phys Lett (Applied Physics Letters) Sep. 1, 2003, vol. 83, No. 9, pp. 1755-1757.
Moriga T et al., "Electrical and Optical Properties of Transparent Conducting Homologous Compounds in the Indium-Gallium-Zinc Oxide System", Journal of the American Ceramic Society, Oct. 1, 1999, vol. 82, No. 10, pp. 2705-2710.
Murat.A et al., "Carrier Generation in Multicomponent Wide-Bandgap Oxides. InGaZnO4.", J. Am. Chem. Soc. (Journal of the American Chemical Society), Mar. 13, 2013, vol. 135, No. 15, pp. 5685-5692.

\* cited by examiner

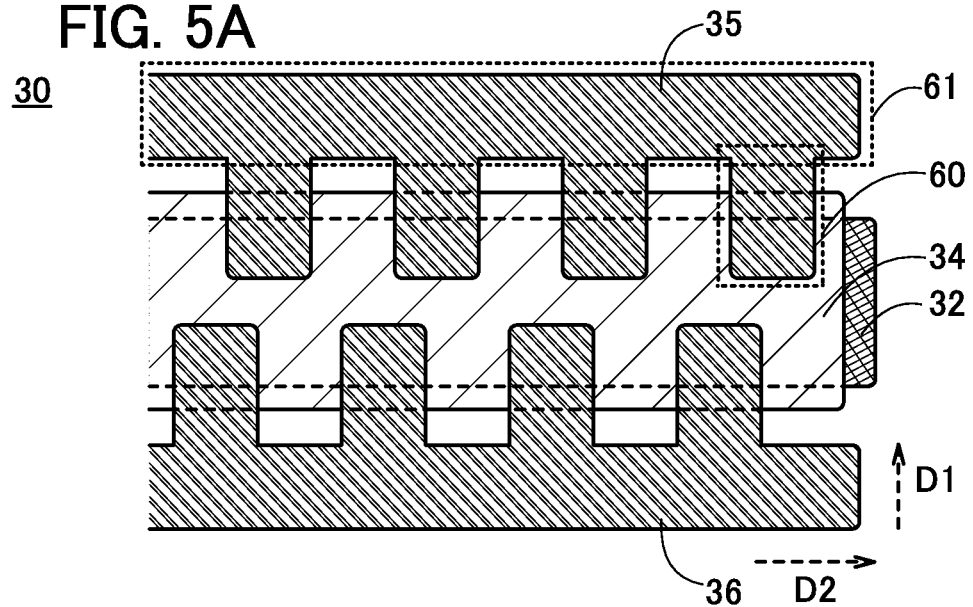
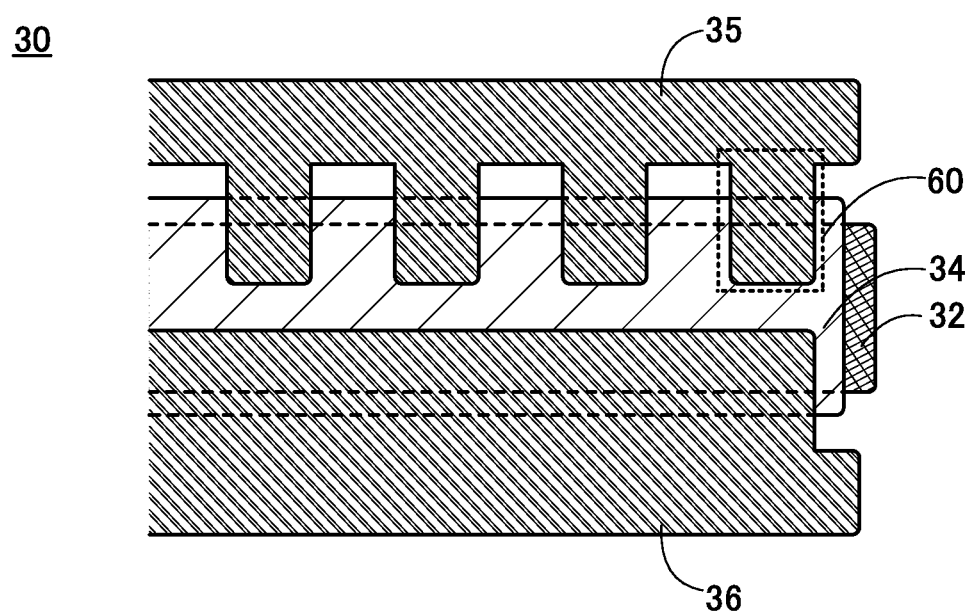

SEMICONDUCTOR DEVICE

BACKGROUND OF THE INVENTION

1. Field of the Invention

The present invention relates to semiconductor devices utilizing semiconductor characteristics.

2. Description of the Related Art

In recent years, a metal oxide having semiconductor characteristics called an oxide semiconductor has attracted attention as a novel semiconductor material having high mobility provided by crystalline silicon and uniform element characteristics provided by amorphous silicon. The metal oxide is used for various applications. For example, indium oxide, which is a well-known metal oxide, is used for a light-transmitting pixel electrode in a liquid crystal display device, a light-emitting device, or the like. Examples of such a metal oxide having semiconductor characteristics include tungsten oxide, tin oxide, indium oxide, and zinc oxide. Transistors each including such a metal oxide having semiconductor characteristics in a channel formation region have been known (Patent Documents 1 and 2).

REFERENCE

Patent Document 1: Japanese Published Patent Application No. 2007-123861
Patent Document 2: Japanese Published Patent Application No. 2007-096055

SUMMARY OF THE INVENTION

Electrical characteristics (e.g., threshold voltage) of a transistor used in a semiconductor device need to be hardly changed due to deterioration over time. In particular, in a circuit including transistors having the same conductivity type, a potential output from the circuit is easily influenced by the threshold voltage of the transistor. Thus, the allowable range of the threshold voltage of the transistor in the circuit including transistors having the same conductivity type tends to be narrower than that of a CMOS circuit. Accordingly, in a semiconductor device, especially, a semiconductor device that includes a circuit including transistors having the same conductivity type, it is important to use transistors whose electrical characteristics are hardly changed due to deterioration over time in ensuring reliability.

Desired electrical characteristics of a semiconductor element in a semiconductor device vary depending on circuit design. In the case of an n-channel transistor that needs to be off when gate voltage is lower than or equal to 0 V, that is, needs to be normally off, the threshold voltage needs to be higher than 0 V. Accordingly, the threshold voltage of the transistor needs to be hardly changed due to deterioration over time and to have an initial value which makes the transistor be normally off.

In view of the above technical background, it is an object of the present invention to provide a semiconductor device including a normally off transistor. It is another object of the present invention to provide a highly reliable semiconductor device.

An initial value of the threshold voltage of a transistor and the amount of change in threshold voltage due to deterioration over time vary depending on relation between the layout of a semiconductor film and the layout of a conductive film functioning as a source electrode or a drain electrode. In one embodiment of the present invention, this relation can be used to achieve the above object.

Specifically, a semiconductor device according to one embodiment of the present invention includes a gate electrode, a gate insulating film, a semiconductor film that overlaps with the gate electrode with the gate insulating film positioned therebetween, and a source electrode and a drain electrode that are in contact with the semiconductor film. An end portion of the semiconductor film is spaced from an end portion of the source electrode or the drain electrode in a region overlapping with the semiconductor film in a channel width direction.

When an end portion of a semiconductor film including an oxide semiconductor is exposed to plasma by etching for forming the end portion, chlorine radical, fluorine radical, or the like generated from an etching gas is easily bonded to a metal element contained in the oxide semiconductor. Thus, in the end portion of the semiconductor film, oxygen bonded to the metal element is easily eliminated, so that an oxygen vacancy is easily formed. However, in one embodiment of the present invention, with such a structure, an end portion of the semiconductor film that overlaps with neither a source electrode nor a drain electrode, that is, an end portion of the semiconductor film in a region different from the region where the source electrode and the drain electrode are formed can be made long. Further, in the end portion of the semiconductor film that overlaps with neither the source electrode nor the drain electrode, that is, the end portion of the semiconductor film in the region different from the region where the source electrode and the drain electrode are formed, the density of a line of electric force extending from the drain electrode to the source electrode can be lowered to decrease an electric field applied to the end portion. Accordingly, even when an oxygen vacancy is formed in the end portion of the semiconductor film, leakage current flowing between the source electrode and the drain electrode through the end portion can be reduced when a transistor needs to be turned off. Consequently, the threshold voltage of the transistor can be controlled so that the transistor is normally off.

In one embodiment of the present invention, by decreasing an electric field applied to the end portion of the semiconductor film, it is possible to prevent an electron (carrier) from being trapped in the gate insulating film from the end portion. As a result, changes in threshold voltage can be suppressed, so that the reliability of the semiconductor device can be increased.

In one embodiment of the present invention, with such a structure, a semiconductor device including a normally off transistor can be provided. Further, in one embodiment of the present invention, with such a structure, a highly reliable semiconductor device can be provided.

BRIEF DESCRIPTION OF THE DRAWINGS

In the accompanying drawings:
FIGS. 5A and 5B are top views of the transistor.

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that the present invention includes, in its category, all the semiconductor devices that include transistors: for example, integrated circuits, RF tags, and semiconductor display devices. The integrated circuit includes, in its category, large scale integrated circuits (LSIs) including a microprocessor, an image processing circuit, a digital signal processor (DSP), and a microcontroller and programmable logic devices (PLDs) such as a field programmable gate array (FPGA) and a complex PLD (CPLD). Further, the semiconductor display device includes, in its category, semiconductor display devices in which transistors are included in driver circuits, such as liquid crystal display devices, light-emitting devices in which a light-emitting element typified by an organic light-emitting element is provided in each pixel, electronic paper, digital micromirror devices (DMDs), plasma display panels (PDPs), and field emission displays (FEDs).

Aspect 1 of Transistor

Figure 1A:
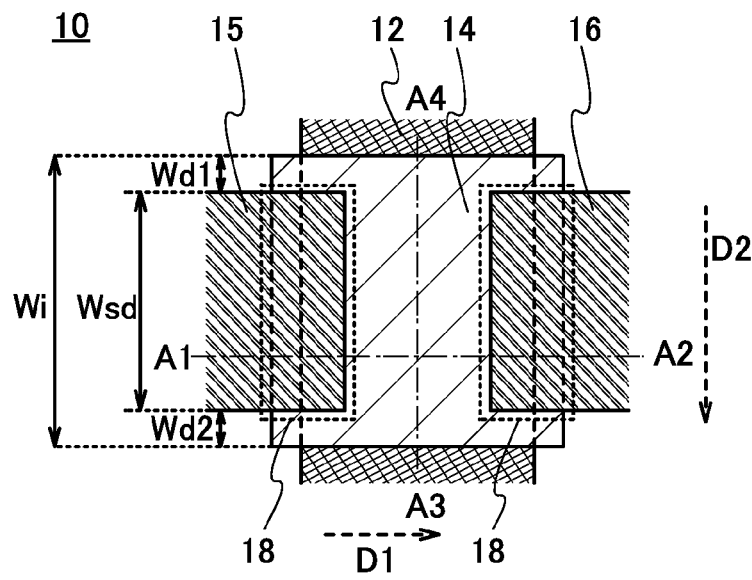
FIGS. 1A to 1C are a top view and cross-sectional views of a transistor.
Figure 1C:
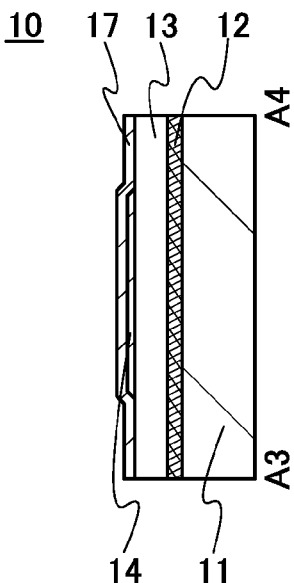
Figure 1B:
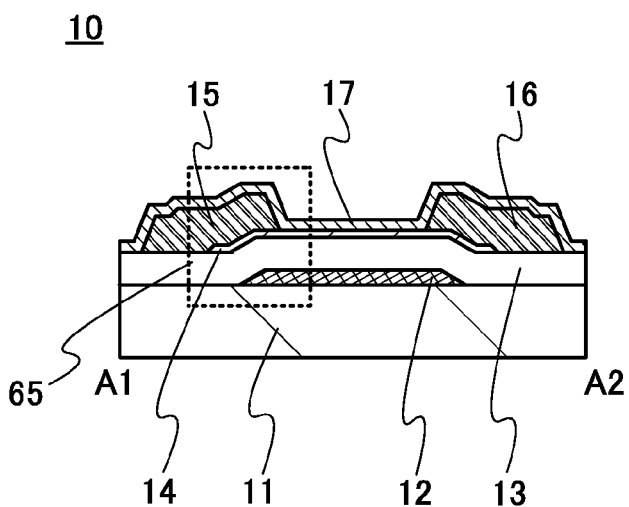

FIGS. 1A to 1C illustrate one aspect of a transistor included in a semiconductor device according to one embodiment of the present invention. FIG. 1A is a top view of a transistor 10. FIG. 1B corresponds to a diagram illustrating a cross-sectional structure of the transistor 10 in FIG. 1A taken along broken line A1-A2. FIG. 1C corresponds to a diagram illustrating a cross-sectional structure of the transistor 10 in FIG. 1A taken along broken line A3-A4. Note that insulating films such as a gate insulating film are not illustrated in FIG. A in order to clarify the layout of the transistor 10.

As illustrated in FIGS. 1A to 1C, the transistor 10 includes, over a substrate 11 having an insulating surface, a conductive film 12 functioning as a gate electrode, a gate insulating film 13 over the conductive film 12, a semiconductor film 14 overlapping with the conductive film 12 with the gate insulating film 13 positioned therebetween, and a conductive film 15 and a conductive film 16 that are in contact with the semiconductor film 14 and function as a source electrode and a drain electrode.

In FIGS. 1A to 1C, an oxide film 17 is provided over the semiconductor film 14, the conductive film 15, and the conductive film 16. In one embodiment of the present invention, the oxide film 17 may be a component of the transistor 10.

In FIG. 1A, a direction in which a carrier moves between the conductive film 15 and the conductive film 16 in the shortest distance is referred to as a channel length direction (indicated by an arrow D1). In addition, in FIG. 1A, a direction perpendicular to the channel length direction is referred to as a channel width direction (indicated by an arrow D2).

In one embodiment of the present invention, an end portion of the semiconductor film 14 is spaced from an end portion of the conductive film 15 or the conductive film 16 in a region overlapping with the semiconductor film 14 in the channel width direction. From another perspective, it can be said that in the transistor 10, the width Wi of the semiconductor film 14 in the channel width direction is larger than the width Wsd of the conductive film 15 or the conductive film 16 in a region 18 where the conductive film 15 or the conductive film 16 overlaps with the semiconductor film 14 in the channel width direction.

Note that in one embodiment of the present invention, end portions of the semiconductor film 14 are spaced from end portions of the conductive film 15 and the conductive film 16 in the channel width direction in the region 18. FIG. 1A illustrates an example in which the end portions of the semiconductor film 14 and the end portions of the conductive film 15 and the conductive film 16 in the region 18 have a space Wd1 and a space Wd2.

In one embodiment of the present invention, with such a structure, the transistor 10 can be normally off, and changes in threshold voltage can be prevented. The reason for this is described in detail below.

Figure 2A:
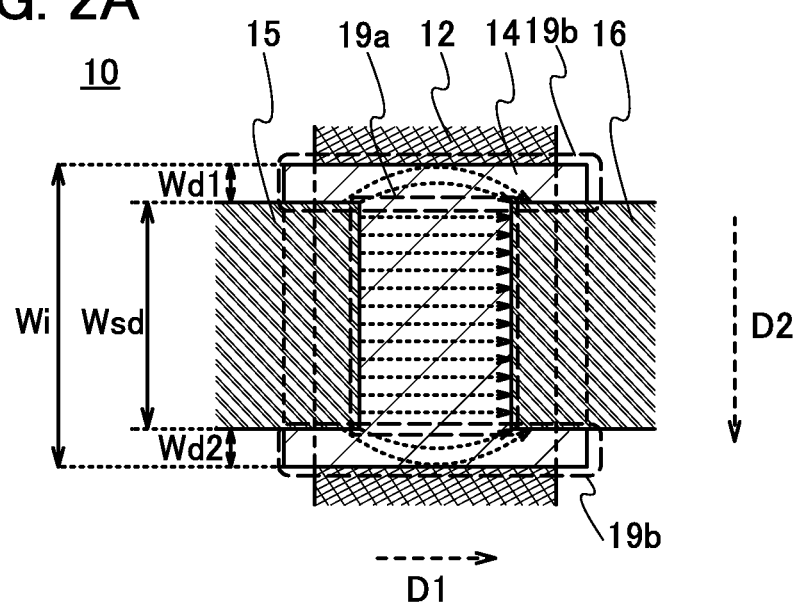
FIGS. 2A and 2B are top views of transistors.

Lines of electric force (indicated by broken arrows) are shown between the conductive film 15 and the conductive film 16 in the top view of the transistor 10 in FIG. 2A. FIG. 2A illustrates lines of electric force at the time when the transistor 10 is an n-channel transistor, the conductive film 15 is a drain electrode, and the conductive film 16 is a source electrode.

In the transistor 10 in FIG. 2A, the lines of electric force extend from the conductive film 15 (drain electrode) to the conductive film 16 (source electrode). In the transistor 10, the lines of electric force exist in a region 19a including a path through which the conductive film 15 is connected to the conductive film 16 in the channel length direction indicated by the arrow D1 in the semiconductor film 14. Further, in the transistor 10, the lines of electric force exist not only in the region 19a but also in a region 19b that is off the path in the semiconductor film 14 to wrap around the conductive film 15 and the conductive film 16.

Figure 2B:
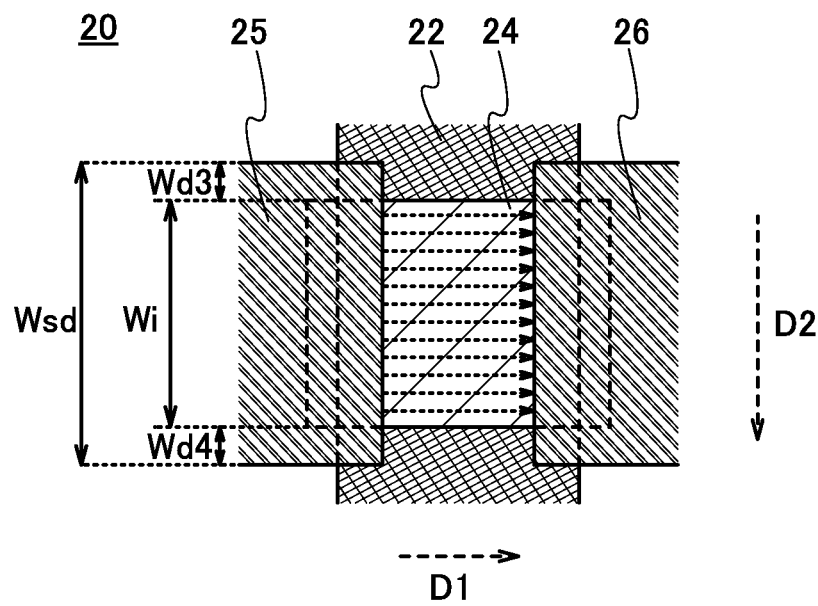

Next, FIG. 2B illustrates a top view of a transistor 20 having a structure different from that of the transistor 10 and lines of electric force (indicated by broken arrows) as a comparison example.

The transistor 20 includes, over an insulating surface, a conductive film 22 functioning as a gate electrode, a gate insulating film (not illustrated) over the conductive film 22, a semiconductor film 24 overlapping with the conductive film 22 with the gate insulating film positioned therebetween, and a conductive film 25 and a conductive film 26 that are in contact with the semiconductor film 24 and function as a source electrode and a drain electrode.

In the transistor 20, an end portion of the conductive film 25 or the conductive film 26 is spaced from an end portion of the semiconductor film 24 in a region overlapping with the conductive film 25 or the conductive film 26 in the channel width direction indicated by the arrow D2. From another perspective, it can be said that in the transistor 20, the width Wi of the semiconductor film 24 in the channel width direction is smaller than the width Wsd of the conductive film 25 or the conductive film 26 in the channel width direction.

FIG. 2B illustrates an example in which end portions of the conductive film 25 or the conductive film 26 and end portions of the semiconductor film 24 in the region overlapping with the conductive film 25 or the conductive film 26 in the channel width direction have a space Wd3 and a space Wd4.

FIG. 2B illustrates lines of electric force at the time when the transistor 20 is an n-channel transistor, the conductive film 25 is a drain electrode, and the conductive film 26 is a source electrode.

In the transistor 20 in FIG. 2B, the lines of electric force extend from the conductive film 25 (drain electrode) to the conductive film 26 (source electrode). In the transistor 20, the lines of electric force exist only along a path through which the conductive film 25 is connected to the conductive film 26 in the channel length direction indicated by the arrow D1 in the semiconductor film 24.

Thus, when the end portions of the semiconductor film 14 in FIG. 2A are compared to the end portions of the semiconductor film 24 in FIG. 2B, end portions of the semiconductor film 14 in the transistor 10 that overlap with neither the conductive film 15 nor the conductive film 16 (i.e., end portions of the semiconductor film 14 in a region different from the region where the conductive film 15 and the conductive film 16 are formed) are longer than end portions of the semiconductor film 24 in the transistor 20 that overlap with neither the conductive film 25 nor the conductive film 26 (i.e., end portions of the semiconductor film 24 in a region different from the region where the conductive film 25 and the conductive film 26 are formed).

When the lines of electric force of the transistor 10 in FIG. 2A are compared to the lines of electric force of the transistor 20 in FIG. 2B, the density of lines of electric force in the end portions of the semiconductor film 14 in the transistor 10 that overlap with neither the conductive film 15 nor the conductive film 16 can be lower than the density of lines of electric force in the end portions of the semiconductor film 24 in the transistor 20 that overlap with neither the conductive film 25 nor the conductive film 26. In other words, an electric field applied to the end portions of the semiconductor film 14 in the region different from the region where the conductive film 15 and the conductive film 16 are formed can be lower than an electric field applied to the end portions of the semiconductor film 24 in the region different from the region where the conductive film 25 and the conductive film 26 are formed.

In the case where the semiconductor film 14 and the semiconductor film 24 each include an oxide semiconductor, when the end portions of the semiconductor film 14 and the semiconductor film 24 are exposed to plasma by etching for forming the end portions, chlorine radical, fluorine radical, or the like generated from an etching gas is easily bonded to a metal element contained in the oxide semiconductor. Thus, in the end portions of the semiconductor film 14 and the semiconductor film 24, oxygen bonded to the metal element is easily eliminated, so that an oxygen vacancy is easily formed.

However, in the transistor 10, the end portions of the semiconductor film 14 that overlap with neither the conductive film 15 nor the conductive film 16 can be made long as described above. Further, in the transistor 10, in the region different from the region where the conductive film 15 and the conductive film 16 are formed, an electric field applied to the end portions of the semiconductor film 14 can be decreased. Accordingly, even when an oxygen vacancy is formed in the end portion of the semiconductor film 14, leakage current flowing between the conductive film 15 and the conductive film 16 through the end portion can be reduced when the transistor 10 needs to be turned off. Consequently, the threshold voltage of the transistor 10 can be controlled so that the transistor 10 is normally off.

In the transistor 10, by decreasing an electric field applied to the end portion of the semiconductor film 14, it is possible to prevent an electron (carrier) from being trapped in the gate insulating film 13 from the end portion. As a result, in the transistor 10, changes in threshold voltage can be suppressed, so that the reliability of the semiconductor device including the transistor 10 can be increased.

Further, in one embodiment of the present invention, a metal oxide may be used for the oxide film 17.

The use of the oxide film 17 having such a structure can space the semiconductor film 14 from a film containing silicon even when the film containing silicon is provided over the oxide film 17. Thus, in the case where the semiconductor film 14 contains indium, silicon, which has higher oxygen bond energy than indium, breaks the bond between indium and oxygen in the end portions of the semiconductor film 14 that overlap with neither the conductive film 15 nor the conductive film 16 and can prevent generation of oxygen vacancies. As a result, in one embodiment of the present invention, the reliability of the transistor can be further increased.

In order to prevent a channel region of the semiconductor film 14 from having n-type conductivity due to an oxygen vacancy, the concentration of silicon in the semiconductor film 14 is preferably lower than or equal to $2 \times 10^{18}$ atoms/cm$^3$, more preferably lower than or equal to $2 \times 10^{17}$ atoms/cm$^3$.

Note that the conductivity of the metal oxide is lower than that of a metal oxide used as an oxide semiconductor in the semiconductor film 14. In order to achieve such a structure, for example, in the case where an In—Ga—Zn-based oxide is used as a metal oxide in the oxide film 17, the metal oxide in the oxide film 17 preferably has an atomic ratio where an atomic percent of In is lower than that of In in the atomic ratio of the metal oxide used for the semiconductor film 14. Specifically, the oxide film 17 can be formed by sputtering using an In—Ga—Zn-based oxide target having a metal atomic ratio of 1:6:4 or 1:3:2.

Note that FIG. 1A and FIG. 2A each illustrate an example in which the end portions of the semiconductor film 14 and the end portions of the conductive film 15 and the conductive film 16 in the region 18 have the space Wd1 and the space Wd2. In one embodiment of the present invention, the above effect owing to one embodiment of the present invention can be obtained even when one of the space Wd1 and the space Wd2 does not exist. However, the structure examples of FIG. 1A and FIG. 2A where both of the space Wd1 and the space Wd2 exist are preferable because the above effect can be enhanced.

Figure 18:
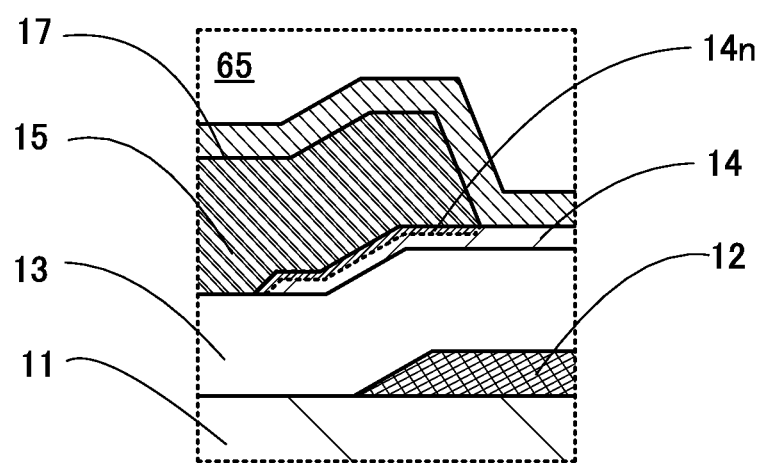
FIG. 18 is a cross-sectional view of a transistor.

In the case where an oxide semiconductor is used for the semiconductor film 14, metal in the conductive film 15 and the conductive film 16 extracts oxygen from the oxide semiconductor depending on a conductive material used for the conductive film 15 and the conductive film 16. In that case, a region in the semiconductor film 14 that is in contact with the conductive film 15 and the conductive film 16 has n-type conductivity due to generation of oxygen vacancies. FIG. 18 is a magnified view of a region 65 that is part of the transistor 10 in FIG. 1A. In FIG. 18, a region 14n in the semiconductor film 14 that is in contact with the conductive film 15 and the conductive film 16 has n-type conductivity.

Since the region 14n having n-type conductivity functions as a source region or a drain region, contact resistance between the semiconductor film 14 and the conductive films 15 and 16 can be lowered. Thus, by forming the region 14n having n-type conductivity, the mobility and on-state current of the transistor 10 can be increased, so that the semiconductor device including the transistor 10 can operate at high speed.

Note that metal in the conductive film 15 and the conductive film 16 might extract oxygen when the conductive film 15 and the conductive film 16 are formed by sputtering or the like or might extract oxygen by heat treatment performed after the conductive film 15 and the conductive film 16 are formed.

Further, the region 14n having n-type conductivity is easily formed by using a conductive material that is easily bonded to oxygen for the conductive film 15 and the conductive film 16. The conductive material can be, for example, Al, Cr, Cu, Ta, Ti, Mo, or W.

Amount of Change in Threshold Voltage

Next, the amount of change in threshold voltage of the transistor 10 in FIG. 2A and the amount of change in threshold voltage of the transistor 20 in FIG. 2B after high voltage is applied to the drain electrodes are described.

First, a transistor A and a transistor B used in the test each have a structure similar to that of the transistor 10. The space Wd1 and the space Wd2 are each 3 μm, the width Wsd of the conductive film 15 and the conductive film 16 is 20 μm, and a space (channel length) between the conductive film 15 and the conductive film 16 is 3 μm. Further, a transistor C and a transistor D used in the test each have a structure similar to that of the transistor 20. The space Wd3 and the space Wd4 are each 3 μm, the width Wi of the semiconductor film 24 is 20 μm, and a space (channel length) between the conductive film 25 and the conductive film 26 is 3 m.

In each of the transistor A and the transistor B, a 200-nm-thick tungsten film is used as the conductive film 12. An insulating film in which a 400-nm-thick silicon nitride film and a 50-nm-thick silicon oxynitride film are sequentially stacked from the conductive film 12 side is used as the gate insulating film. A conductive film in which a 50-nm-thick tungsten film, a 400-nm-thick aluminum film, and a 100-nm-thick titanium film are sequentially stacked from the semiconductor film 14 side is used as the conductive film 15 and the conductive film 16.

Materials and thicknesses of the gate insulating films and the conductive films used in the transistor C and the transistor D are the same as those in the transistor A and the transistor B. Specifically, in each of the transistor C and the transistor D, a 200-nm-thick tungsten film is used as the conductive film 22. An insulating film in which a 400-nm-thick silicon nitride film and a 50-nm-thick silicon oxynitride film are sequentially stacked from the conductive film 22 side is used as the gate insulating film. A conductive film in which a 50-nm-thick tungsten film, a 400-nm-thick aluminum film, and a 100-nm-thick titanium film are sequentially stacked from the semiconductor film 24 side is used as the conductive film 25 and the conductive film 26.

Note that in this specification, an oxynitride used for a silicon oxynitride film or the like is a substance that includes more oxygen than nitrogen, and a nitride oxide is a substance that includes more nitrogen than oxygen.

As each of the semiconductor film 14 of the transistor A and the semiconductor film 24 of the transistor C, a single-layer oxide semiconductor film is used. The oxide semiconductor film is a 35-nm-thick In—Ga—Zn-based oxide semiconductor film (IGZO (111)) formed using an oxide target in which a composition ratio of indium (In) to gallium (Ga) and zinc (Zn) is 1:1:1.

As each of the semiconductor film 14 of the transistor B and the semiconductor film 24 of the transistor D, a two-layer oxide semiconductor film is used. An oxide semiconductor film that is close to the gate insulating film is a 35-nm-thick In—Ga—Zn-based oxide semiconductor film (IGZO (111)) formed using an oxide target a composition ratio of indium (In) to gallium (Ga) and zinc (Zn) is 1:1:1. An oxide semiconductor film that is far from the gate insulating film is a 20-nm-thick In—Ga—Zn-based oxide semiconductor film (IGZO (132)) formed using an oxide target a composition ratio of indium (In) to gallium (Ga) and zinc (Zn) is 1:3:2.

In the test, the voltage of the drain electrode (referred to as drain voltage) at the time when the gate electrode and the source electrode have the same potential (reference potential) is 30 V. Further, in the test, stress is applied to the transistors A to D while the temperature of a substrate provided with the transistors A to D is set to 125° C. and the transistors A to D are left in a darkroom for one hour without light irradiation.

Figure 16A:
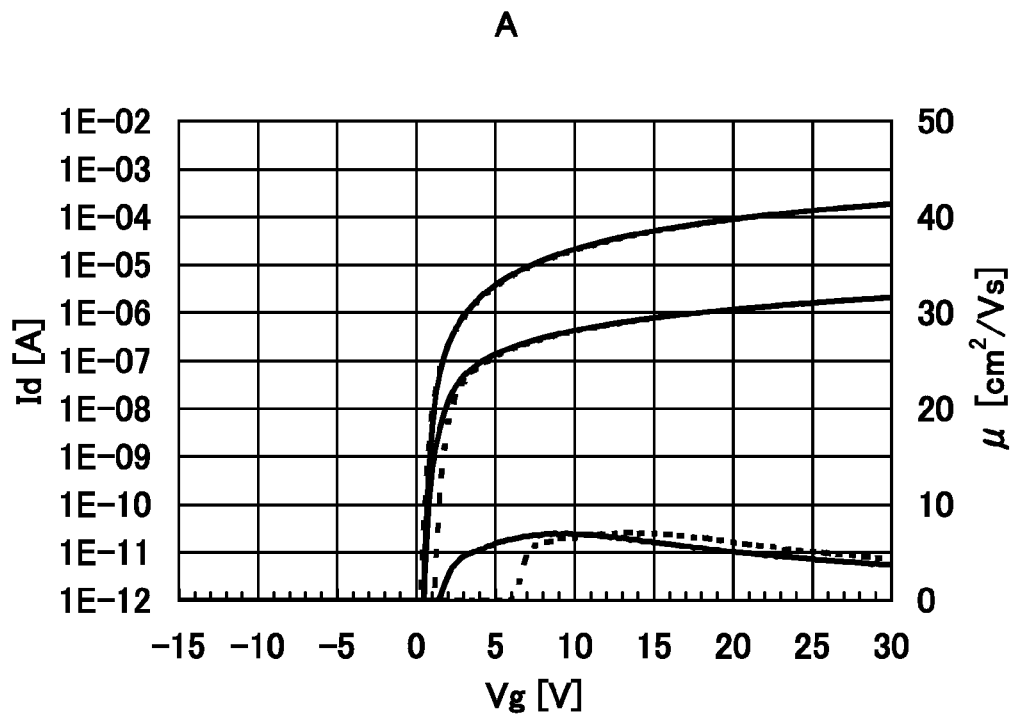
FIGS. 16A and 16B are graphs each showing relation between gate voltage and drain current of a transistor.
Figure 16B:
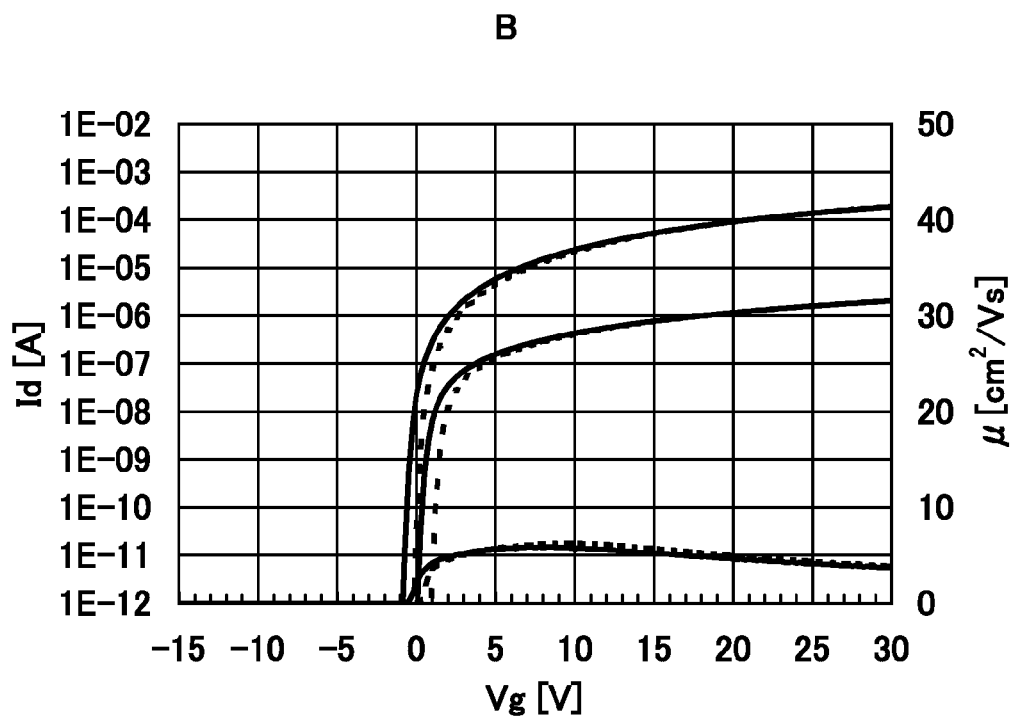
Figure 17A:
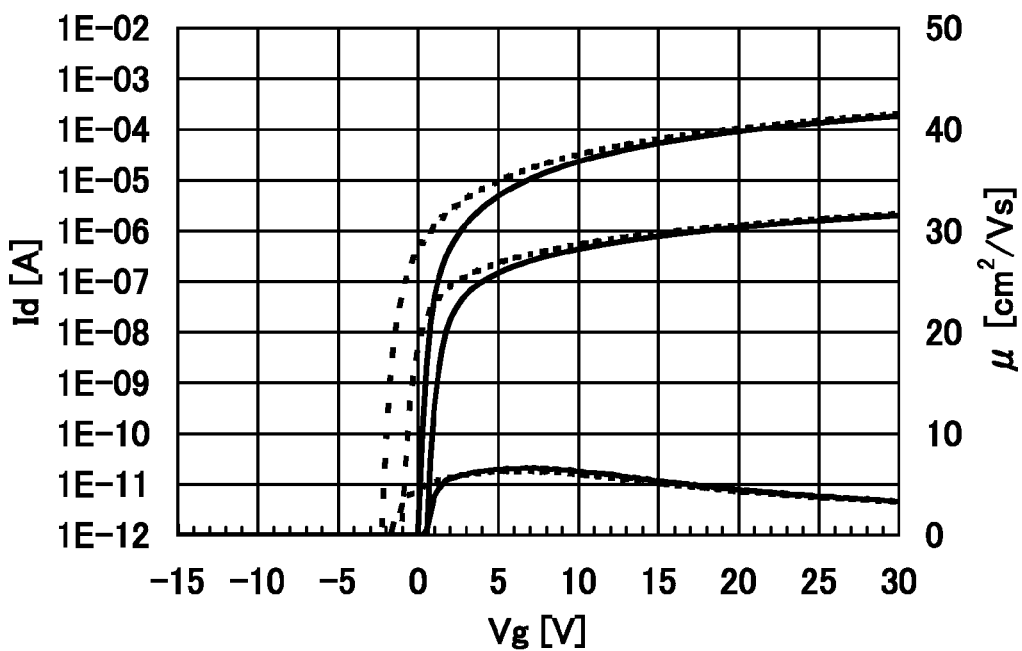
FIGS. 17A and 17B are graphs each showing relation between gate voltage and drain current of a transistor.
Figure 17B:
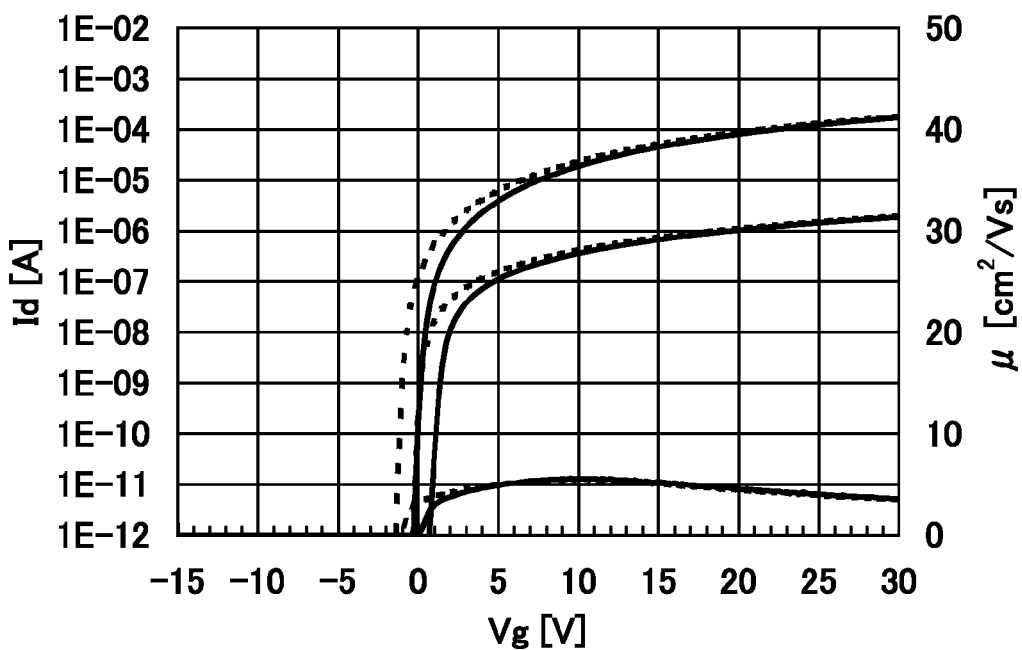

FIGS. 16A and 16B and FIGS. 17A and 17B show the relation between gate voltage Vg (V) and drain current Id (A) of each of the transistors A to D that are measured before and after application of stress. Note that in FIGS. 16A and 16B and FIGS. 17A and 17B, the relation between the gate voltage Vg and the drain current Id before application of stress is indicated by a broken line, and the relation between the gate voltage Vg and the drain current Id after application of stress is indicated by a solid line. FIG. 16A shows data of the transistor A, and FIG. 16B shows data of the transistor B. FIG. 17A shows data of the transistor C, and FIG. 17B shows data of the transistor D.

Note that the drain current of each of the transistors A to D is measured by changing the gate voltage Vg from −15 V to +30 V. The measurement is performed with drain voltages Vd of 0.1 V and 10 V at 40° C.

Figure 8:
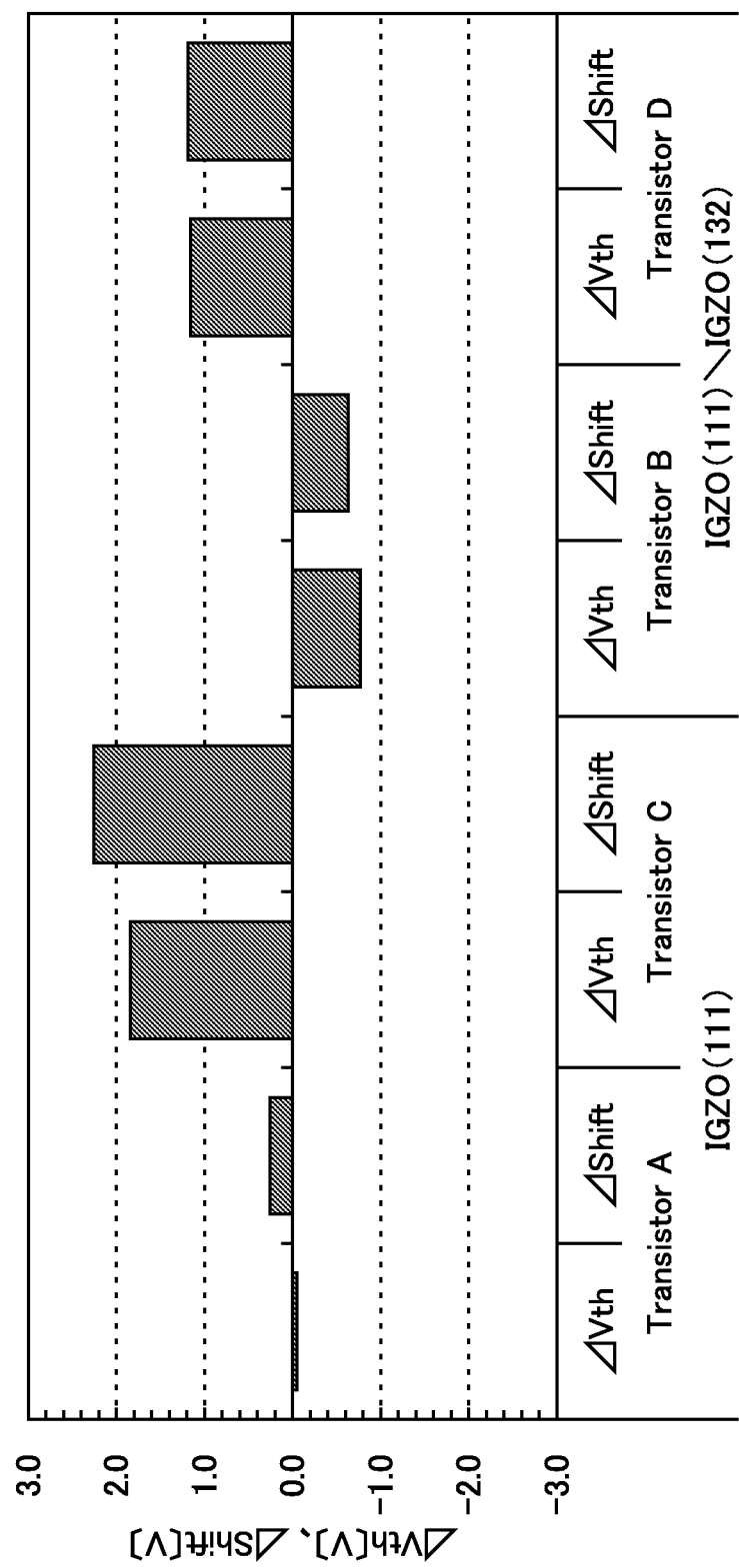
FIG. 8 is a graph showing the measured amount of change in threshold voltage and the measured amount of change in shift value.

FIG. 8 is a graph showing the amount of change in threshold voltage (ΔVth) and the amount of change in shift value (ΔShift) generated before and after application of stress that are calculated using the relation between the gate voltage Vg (V) and the drain current Id (A) shown in FIGS. 16A and 16B and FIGS. 17A and 17B. Note that the mobility of each transistor is calculated on the assumption that relative dielectric constant is 4 and that the thickness of the gate insulating film is 280 nm. Table I shows the amount of change in threshold voltage (ΔVth) and the amount of change in shift value (ΔShift) generated before and after application of stress.

TABLE 1

| IGZO (111) | | | | IGZO (111)\IGZO (132) | | | |
| --- | --- | --- | --- | --- | --- | --- | --- |
| Transistor A | | Transistor C | | Transistor B | | Transistor D | |
| ΔVth | ΔShift | ΔVth | ΔShift | ΔVth | ΔShift | ΔVth | ΔShift |
| −0.05 | 0.25 | 1.84 | 2.26 | −0.77 | −0.63 | 1.16 | 1.19 |

Note that the shift value is defined as the value of gate voltage at the time when drain current rises. Specifically, in a graph showing the relation between gate voltage and drain current, the shift value can be defined as voltage at an intersection of a tangent where slope change in drain current is the steepest and a graduation line corresponding to the lowest drain current. The shift value is a value at the time when drain voltage is 10V.

As can be seen from FIG. 8, the amount of change in threshold voltage (ΔVth) and the amount of change in shift value (ΔShift) in the transistor A and the transistor B each having the structure of the transistor 10 are smaller than those in the transistor C and the transistor D each having the structure of the transistor 20. Accordingly, the test results indicate that the threshold voltage of the transistor 10 is less likely to be shifted in a positive direction and the reliability of the transistor 10 is higher than that of the transistor 20.

Aspect 2 of Transistor

Figure 3A:
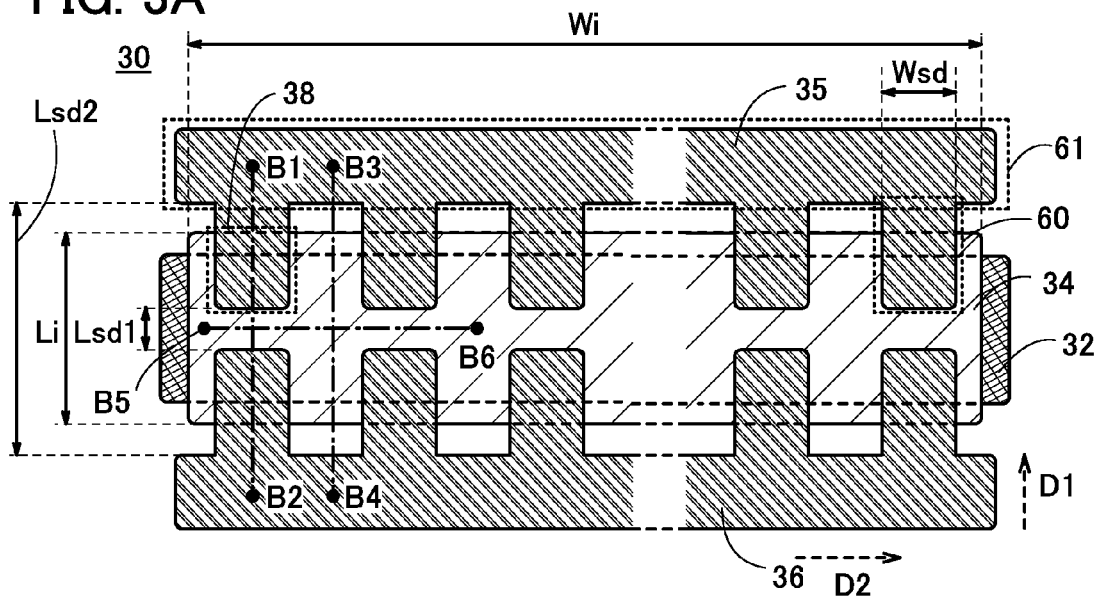
FIGS. 3A to 3D are a top view and cross-sectional views of a transistor.
Figure 3B:
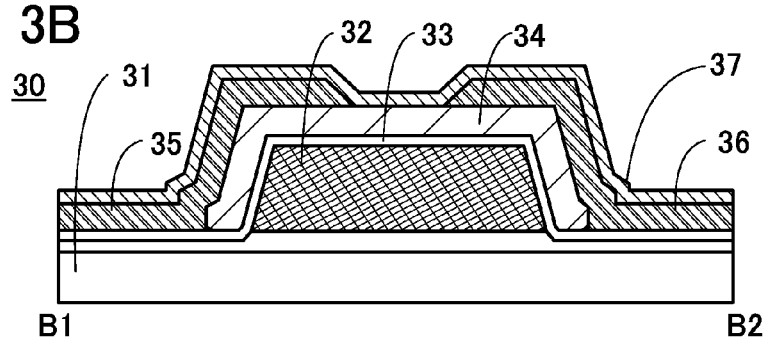
Figure 3C:
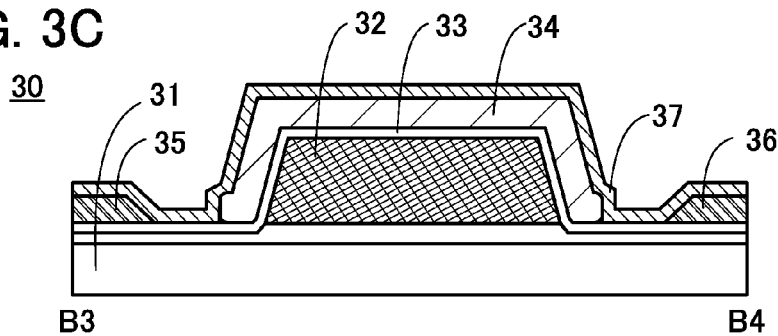
Figure 3D:
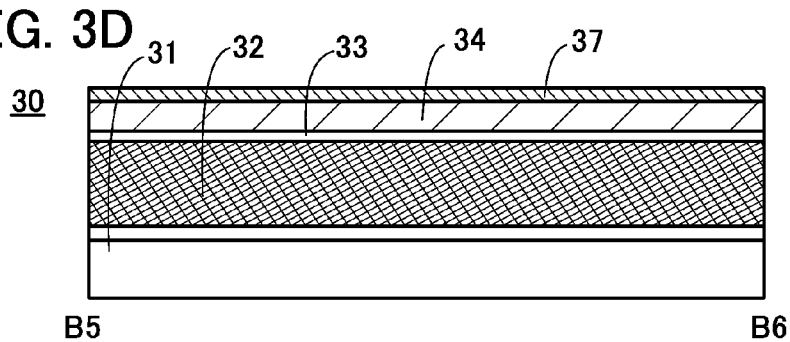

Next, FIGS. 3A to 3D illustrate another aspect of a transistor included in a semiconductor device according to one embodiment of the present invention. FIG. 3A is a top view of a transistor 30. FIG. 3B corresponds to a diagram illustrating a cross-sectional structure of the transistor 30 in FIG. 3A taken along broken line B1-B2. FIG. 3C corresponds to a diagram illustrating a cross-sectional structure of the transistor 30 in FIG. 3A taken along broken line B3-B4. FIG. 3D corresponds to a diagram illustrating a cross-sectional structure of the transistor 30 in FIG. 3A taken along broken line B5-B6. Note that insulating films such as a gate insulating film are not illustrated in FIG. 3A in order to clarify the layout of the transistor 30.

Like the transistor 10, the transistor 30 illustrated in FIGS. 3A to 3D includes, over a substrate 31 having an insulating surface, a conductive film 32 functioning as a gate electrode, a gate insulating film 33 over the conductive film 32, a semiconductor film 34 overlapping with the conductive film 32 with the gate insulating film 33 positioned therebetween, and a conductive film 35 and a conductive film 36 that are in contact with the semiconductor film 34 and function as a source electrode and a drain electrode.

In FIGS. 3A to 3D, an oxide film 37 is provided over the semiconductor film 34, the conductive film 35, and the conductive film 36. In one embodiment of the present invention, the oxide film 37 may be a component of the transistor 30.

The structure of the transistor 30 differs from the structure of the transistor 10 illustrated in FIGS. 1A to 1C in that the conductive film 35 and the conductive film 36 each have a comb-like shape. Specifically, a comb-like shape corresponds to a shape in which a plurality of convex portions are provided in end portions. The conductive film 35 and the conductive film 36 having a comb-like shape each include a plurality of convex portions 60 and a joint part 61 for coupling the plurality of convex portions 60.

In one embodiment of the present invention, in the transistor 30, an end portion of the semiconductor film 34 is spaced from an end portion of the conductive film 35 or the conductive film 36 in a region overlapping with the semiconductor film 34 in a channel width direction indicated by the arrow D2. From another perspective, it can be said that in the transistor 30, the width Wi of the semiconductor film 34 in the channel width direction is larger than the width Wsd of the conductive film 35 or the conductive film 36 in a region 38 where the conductive film 35 or the conductive film 36 overlaps with the semiconductor film 34 in the channel width direction.

In addition, in one embodiment of the present invention, the joint part 61 of the conductive film 35 or the conductive film 36 is spaced from the end portion of the semiconductor film 34. In other words, in the convex portion 60, the conductive film 35 or the conductive film 36 partly overlaps with the semiconductor film 34. Thus, in the end portion of the conductive film 35 or the conductive film 36 in the region overlapping with the semiconductor film 34, the plurality of convex portions 60 are spaced from each other. Note that in order that the joint part 61 of the conductive film 35 and the joint part 61 of the conductive film 36 are spaced from the end portions of the semiconductor film 34, in a channel length direction indicated by the arrow D1, a space Lsd2 between the end portions of the joint parts of the conductive film 35 and the conductive film 36 needs to be larger than the width Li of the semiconductor film 34.

In one embodiment of the present invention, with a structure where the joint part 61 of the conductive film 35 or the conductive film 36 is spaced from the end portion of the semiconductor film 34, the transistor 30 can be normally off, and changes in threshold voltage can be prevented. The reason for this is described in detail below.

Figure 4:
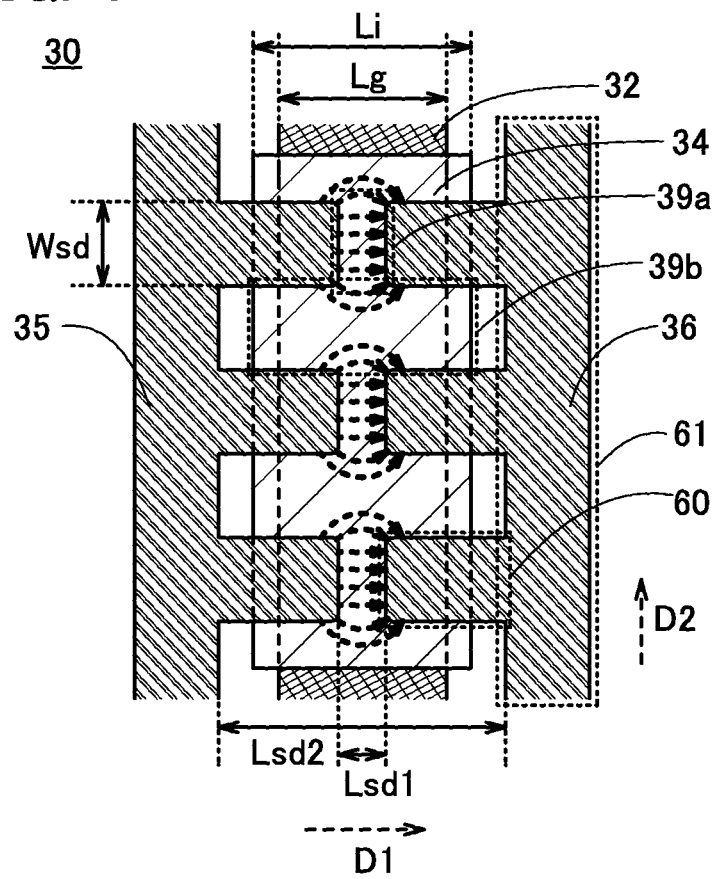
FIG. 4 is a top view of the transistor.

Lines of electric force (indicated by broken arrows) are shown between the conductive film 35 and the conductive film 36 in the top view of part of the transistor 30 in FIG. 4. FIG. 4 illustrates lines of electric force at the time when the transistor 30 is an n-channel transistor, the conductive film 35 is a drain electrode, and the conductive film 36 is a source electrode.

In the transistor 30, the end portion of the semiconductor film 34 is spaced from the end portion of the conductive film 35 or the conductive film 36 in the region overlapping with the semiconductor film 34 in the channel width direction; thus, the end portions of the semiconductor film 34 that overlap with neither the conductive film 35 nor the conductive film 36 can be made long. Further, in the transistor 30, in a region different from the region where the conductive film 35 and the conductive film 36 are formed, an electric field applied to the end portions of the semiconductor film 34 that can be a current path of the conductive film 35 and the conductive film 36 can be decreased. Accordingly, even when an oxygen vacancy is formed in the end portion of the semiconductor film 34, leakage current flowing between the conductive film 35 and the conductive film 36 through the end portion can be reduced when the transistor 30 needs to be turned off. Consequently, the threshold voltage of the transistor 30 can be controlled so that the transistor 30 is normally off.

In the transistor 30, by decreasing an electric field applied to the end portion of the semiconductor film 34, it is possible to prevent an electron (carrier) from being trapped in the gate insulating film 33 from the end portion. As a result, in the transistor 30, changes in threshold voltage can be suppressed, so that the reliability of the semiconductor device including the transistor 30 can be increased.

In the transistor 30 in FIG. 4, the lines of electric force extend from the conductive film 35 (drain electrode) to the conductive film 36 (source electrode). In the transistor 30, the lines of electric force exist in a region 39a including a path through which the conductive film 35 is connected to the conductive film 36 in the channel length direction indicated by the arrow D1 in the semiconductor film 34. Further, in the transistor 30, the lines of electric force exist not only in the region 39a but also in a region 39b that is off the path in the semiconductor film 34 to wrap around the conductive film 35 and the conductive film 36.

Thus, in the case of the transistor 30, compared to the transistor where the joint part 61 of the conductive film 35 or the conductive film 36 overlaps with the semiconductor film 34, the density of the lines of electric force that extend from the conductive film 35 to the conductive film 36 can be decreased. Accordingly, in the transistor 30, it is possible to prevent concentration of an electric field not only in the end portion of the semiconductor film 34 but also in the inside of the semiconductor film 34. As a result, in the transistor 30, changes in threshold voltage can be suppressed, so that the reliability of the semiconductor device can be increased.

In addition, in one embodiment of the present invention, the convex portion 60 of the conductive film 35 and the convex portion 60 of the conductive film 36 have the space Lsd1 in the channel length direction indicated by the arrow D1, and the convex portion 60 of the conductive film 35 and the convex portion 60 of the conductive film 36 do not interlock with each other. With such a structure, the transistor 30 can have a smaller area of a region where the conductive film 32 functioning as a gate electrode overlaps with the conductive film 35 or the conductive film 36, so that a capacitor formed in the region can be made small. Then, since the capacitor is small, the transistor 30 can have a small subthreshold swing (S value).

Note that in the case of a transistor having a large subthreshold swing, if the threshold voltage becomes lower, the transistor is likely to be normally on where off-state current flowing at a gate voltage of 0 V is high. Thus, it is difficult for a circuit that includes transistors having the same conductivity type to operate correctly. Since the threshold voltage of the transistor 30 can be lowered and the subthreshold swing can be decreased, the transistor can be normally off more reliably. As a result, by using the transistor 30, the circuit that includes transistors having the same conductivity type can operate correctly more reliably.

Compared to the transistor 10 illustrated in FIGS. 1A to 1C, an electron depletion layer of the transistor 30 is likely to be spread on a back channel side, that is, the center of the channel width of a region that is near a surface of the semiconductor film 34 opposite to a surface facing the gate electrode when negative gate voltage is applied. Accordingly, the transistor 30 can have smaller effective channel width than the transistor 10 illustrated in FIGS. 1A to 1C. Consequently, the region through which off-state current flows is narrowed, so that the off-state current can be reduced.

Further, in one embodiment of the present invention, a metal oxide may be used for the oxide film 37.

The use of the oxide film 37 having such a structure can space the semiconductor film 34 from a film containing silicon even when the film containing silicon is provided over the oxide film 37. Thus, in the case where the semiconductor film 34 contains indium, silicon, which has higher oxygen bond energy than indium, breaks the bond between indium and oxygen in the end portions of the semiconductor film 34 that overlap with neither the conductive film 35 nor the conductive film 36 and can prevent generation of oxygen vacancies. As a result, in one embodiment of the present invention, the reliability of the transistor can be further increased.

Note that the conductivity of the metal oxide is lower than that of a metal oxide used as an oxide semiconductor in the semiconductor film 34. In order to achieve such a structure, for example, in the case where an In—Ga—Zn-based oxide is used as a metal oxide in the oxide film 37, the metal oxide in the oxide film 37 preferably has an atomic ratio where an atomic percent of In is lower than that of In in the atomic ratio of the metal oxide used for the semiconductor film 34. Specifically, the oxide film 37 can be formed by sputtering using an In—Ga—Zn-based oxide target having a metal atomic ratio of 1:6:4 or 1:3:2.

Like the transistor 10, regions that are in contact with the conductive film 35 and the conductive film 36 in the semiconductor film 34 may have n-type conductivity. With such a structure, the mobility and on-state current of the transistor 30 can be increased, so that the semiconductor device including the transistor 30 can operate at high speed.

Aspect 3 of Transistor

Note that the transistor 30 illustrated in FIGS. 3A to 3D has a structure where the convex portion 60 of the conductive film 35 completely overlaps with the convex portion 60 of the conductive film 36 in the channel length direction. However, in one embodiment of the present invention, the convex portions 60 of the conductive film 35 and the conductive film 36 may partly overlap with each other in the channel length direction.

FIG. 5A is a top view illustrating one aspect of the transistor 30 where the convex portions 60 partly overlap with each other in the channel length direction. The transistor 30 illustrated in FIG. 5A has a structure where the convex portion 60 of the conductive film 35 partly overlaps with the convex portion 60 of the conductive film 36 in the channel length direction indicated by the arrow D1.

In the transistor 30 illustrated in FIGS. 3A to 3D, the conductive film 35 and the conductive film 36 each include the plurality of convex portions 60. However, in the transistor 30, one of the conductive film 35 and the conductive film 36 may include the plurality of convex portions 60.

FIG. 5B is a top view illustrating one aspect of the transistor 30 where the conductive film 35 include the plurality of convex portions 60 and the conductive film 36 does not include the plurality of convex portions 60. In FIG. 5B, unlike the end portion of the conductive film 35 in a region overlapping with the semiconductor film 34, the end portion of the conductive film 36 in a region overlapping with the semiconductor film 34 is a series of end portions.

Even in the case of the transistor 30 illustrated in FIG. 5A and FIG. 5B, an advantageous effect of one embodiment of the present invention can be obtained as in the case of the transistor 30 illustrated in FIGS. 3A to 3D.

Aspect 4 of Transistor

Note that FIGS. 1A to 1C, FIGS. 2A and 2B, FIGS. 3A to 3D, FIG. 4, and FIGS. 5A and 5B each illustrate a bottom-gate transistor including a semiconductor film over a gate electrode. However, the transistors illustrated in FIGS. 1A to 1C, FIGS. 2A and 2B, FIGS. 3A to 3D, FIG. 4, and FIGS. 5A and 5B may each be a top-gate transistor including a semiconductor film below a gate electrode.

Figure 6A:
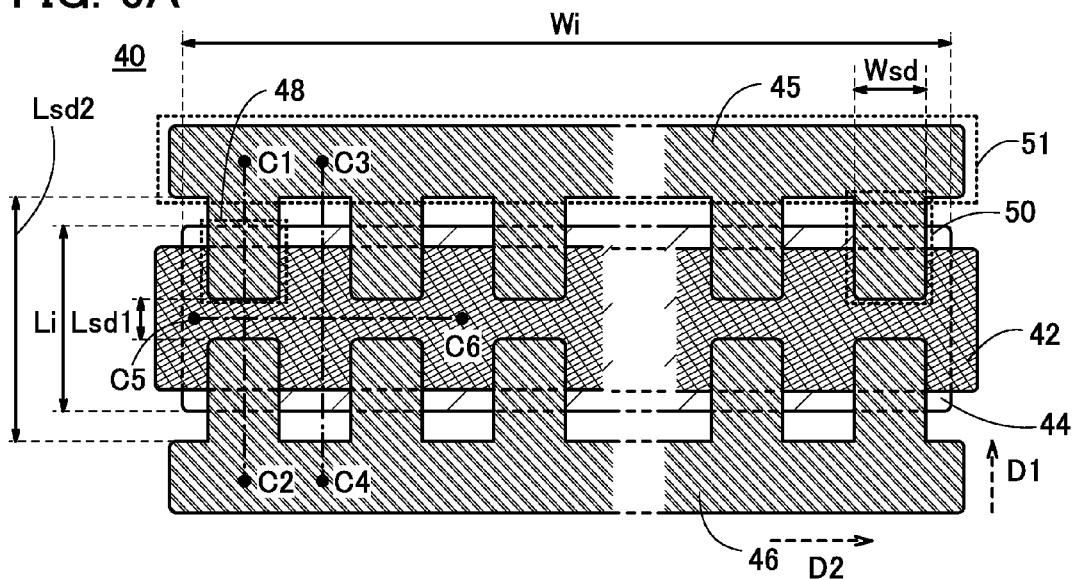
FIGS. 6A to 6D are a top view and cross-sectional views of a transistor.
Figure 6B:
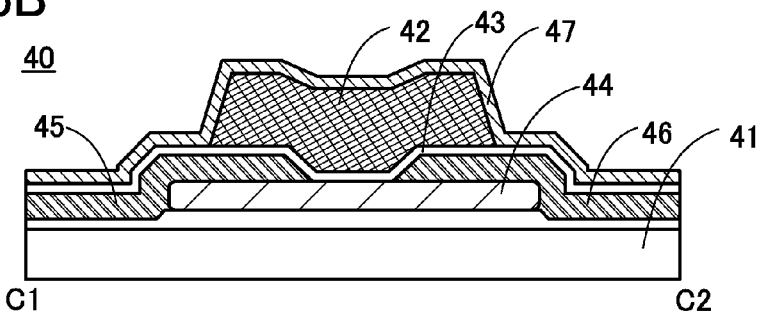
Figure 6C:
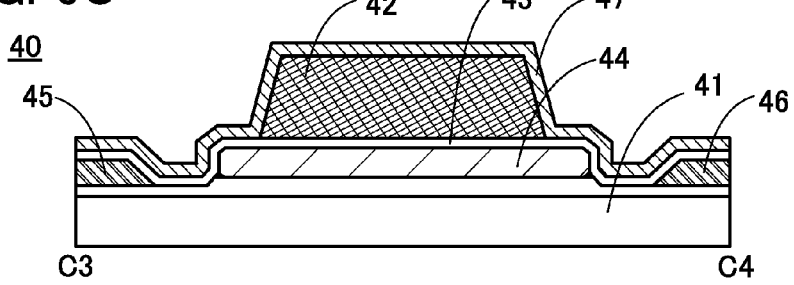
Figure 6D:
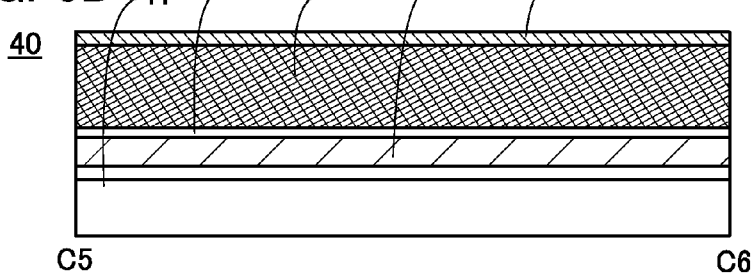

FIGS. 6A to 6D illustrate one aspect of a top-gate transistor included in a semiconductor device according to one embodiment of the present invention. FIG. 6A is a top view of a transistor 40. FIG. 6B corresponds to a diagram illustrating a cross-sectional structure of the transistor 40 in FIG. 6A taken along broken line C1-C2. FIG. 6C corresponds to a diagram illustrating a cross-sectional structure of the transistor 40 in FIG. 6A taken along broken line C3-C4. FIG. 6D corresponds to a diagram illustrating a cross-sectional structure of the transistor 40 in FIG. 6A taken along broken line C5-C6. Note that insulating films such as a gate insulating film are not illustrated in FIG. 6A in order to clarify the layout of the transistor 40.

The transistor 40 illustrated in FIGS. 6A to 6D includes, over a substrate 41 having an insulating surface, a semiconductor film 44, a conductive film 45 and a conductive film 46 that function as a source electrode and a drain electrode and are provided over the semiconductor film 44, a gate insulating film 43 over the semiconductor film 44, the conductive film 45, and the conductive film 46, and a conductive film 42 that functions as a gate electrode and overlaps with the semiconductor film 44 with the gate insulating film 43 positioned therebetween.

In FIGS. 6A to 6D, an oxide film 47 is provided over the gate insulating film 43 and the conductive film 42. In one embodiment of the present invention, the oxide film 47 may be a component of the transistor 40.

The structure of the transistor 40 is the same as the structure of the transistor 30 illustrated in FIGS. 3A to 3D in that the conductive film 45 and the conductive film 46 each have a comb-like shape. The conductive film 45 and the conductive film 46 having a comb-like shape each include a plurality of convex portions 50 and a joint part 51 for coupling the plurality of convex portions 50.

The structure of the transistor 40 is the same as the structure of the transistor 30 illustrated in FIGS. 3A to 3D in that an end portion of the semiconductor film 44 is spaced from an end portion of the conductive film 45 or the conductive film 46 in a region overlapping with the semiconductor film 44 in a channel width direction indicated by the arrow D2. From another perspective, it can be said that in the transistor 40, the width Wi of the semiconductor film 44 in the channel width direction is larger than the width Wsd of the conductive film 45 or the conductive film 46 in a region 48 where the conductive film 45 or the conductive film 46 overlaps with the semiconductor film 44 in the channel width direction.

The structure of the transistor 40 is also the same as the structure of the transistor 30 illustrated in FIGS. 3A to 3D in that the joint part 51 of the conductive film 45 or the conductive film 46 is spaced from the end portion of the semiconductor film 44. Thus, in the end portion of the conductive film 45 or the conductive film 46 in the region overlapping with the semiconductor film 44, the plurality of convex portions 50 are spaced from each other. Note that in order that the joint part 51 of the conductive film 45 and the joint part 51 of the conductive film 46 are spaced from the end portions of the semiconductor film 44, in a channel length direction indicated by the arrow D1, a space Lsd2 between the end portions of the joint parts of the conductive film 45 and the conductive film 46 needs to be larger than the width Li of the semiconductor film 44.

Note that like the transistor 10, regions that are in contact with the conductive film 45 and the conductive film 46 in the semiconductor film 44 may have n-type conductivity. With such a structure, the mobility and on-state current of the transistor 40 can be increased, so that the semiconductor device including the transistor 40 can operate at high speed.

Layout of Transistors

Figure 7A:
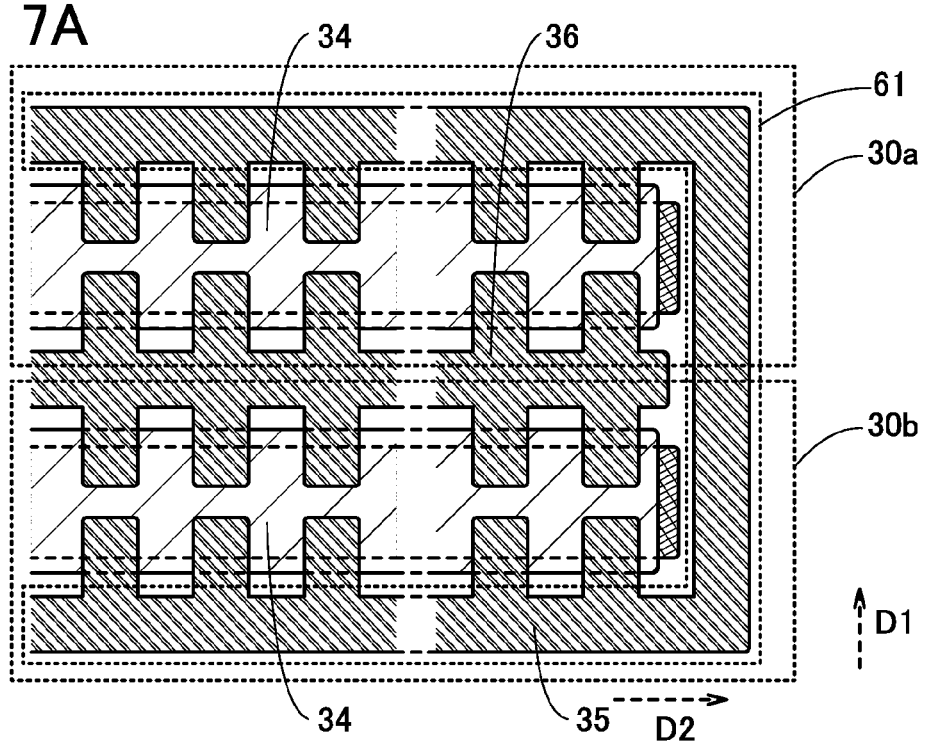
FIGS. 7A and 7B are top views of the transistors.

FIG. 7A illustrates an example of a top view of the two transistors 30 illustrated in FIGS. 3A to 3D connected to each other in parallel.

Note that in this specification, a state in which transistors are connected to each other in series means, for example, a state in which only one of a source electrode and a drain electrode of a first transistor is connected to only one of a source electrode and a drain electrode of a second transistor. In addition, a state in which transistors are connected to each other in parallel means a state in which one of a source electrode and a drain electrode of a first transistor is connected to one of a source electrode and a drain electrode of a second transistor and the other of the source electrode and the drain electrode of the first transistor is connected to the other of the source electrode and the drain electrode of the second transistor.

FIG. 7A illustrates the two transistors 30 illustrated in FIGS. 3A to 3D as a transistor 30a and a transistor 30b. The conductive film 35 of the transistor 30a and the conductive film 35 of the transistor 30b share the joint part 61. The semiconductor film 34 of the transistor 30a and the semiconductor film 34 of the transistor 30b are positioned in such a way that a channel length direction indicated by the arrow D1 and a channel width direction indicated by the arrow D2 of the transistor 30a are substantially aligned with those of the transistor 30b.

Figure 7B:
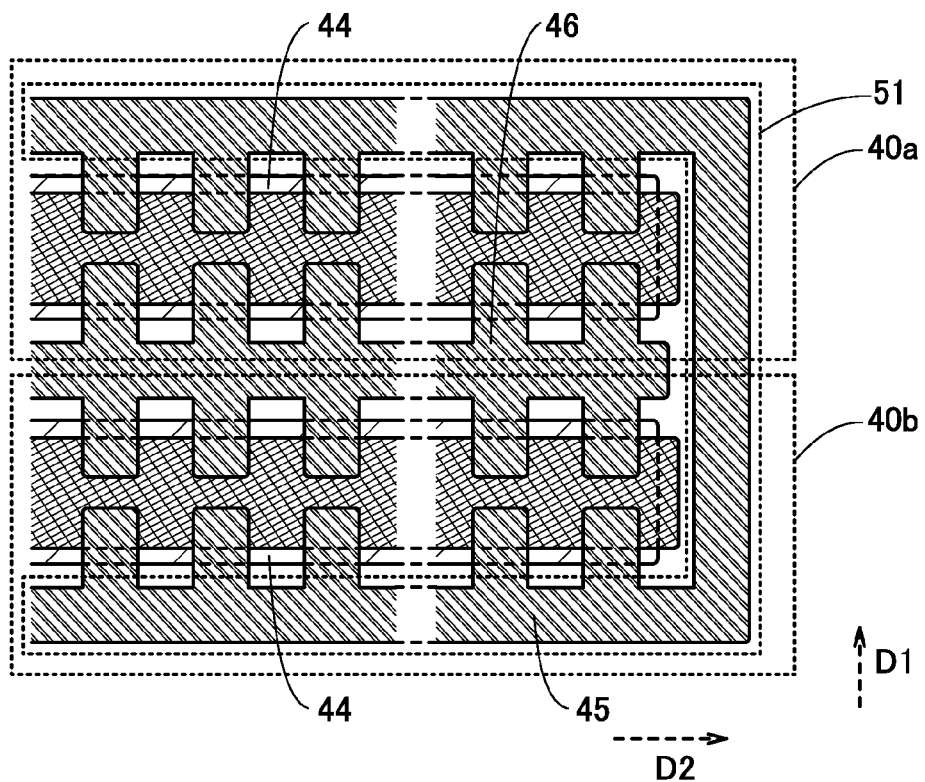

FIG. 7B illustrates the two transistors 40 illustrated in FIGS. 6A to 6D as a transistor 40a and a transistor 40b. The conductive film 45 of the transistor 40a and the conductive film 45 of the transistor 40b share the joint part 51. The semiconductor film 44 of the transistor 40a and the semiconductor film 44 of the transistor 40b are positioned in such a way that a channel length direction indicated by the arrow D1 and a channel width direction indicated by the arrow D2 of the transistor 40a are substantially aligned with those of the transistor 40b.

Note that although FIGS. 7A and 7B each illustrate the example in which two transistors are connected to each other in parallel, three or more transistors can be similarly connected to each other in parallel.

As illustrated in FIGS. 7A and 7B, by providing the plurality of transistors 30 or 40, the proportion of a regular pattern in layout of a mask used for the plurality of transistors 30 or 40 can be increased. In the case where the proportion of the regular pattern of the mask is low, shape defects are likely to occur in a photolithography process using the mask because of interference of light emitted from an exposure apparatus, for example, the width of a conductive film, an insulating film, a semiconductor film, or the like processed by photolithography is partly narrow. However, in FIGS. 7A and 7B, the proportion of the regular pattern in layout of the mask used for the plurality of transistors 30 or 40 can be increased, so that it is possible to prevent generation of shape defects in a conductive film, an insulating film, or a semiconductor film after a photolithography process.

Semiconductor Film

In a semiconductor device according to one embodiment of the present invention, a semiconductor film containing amorphous, microcrystalline, polycrystalline, or single crystal silicon, germanium, or the like may be used as a semiconductor film of a transistor. Alternatively, a semiconductor film containing a semiconductor such as an oxide semiconductor whose bandgap is wider than that of silicon and whose intrinsic carrier density is lower than that of silicon may be used.

Any of the following can be used as silicon: amorphous silicon formed by sputtering or vapor deposition such as plasma-enhanced CVD; polycrystalline silicon obtained in such a manner that amorphous silicon is crystallized by laser annealing or the like; single crystal silicon obtained in such a manner that a surface portion of a single crystal silicon wafer is separated by implantation of hydrogen ions or the like into the silicon wafer; and the like.

A highly-purified oxide semiconductor (purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly-purified oxide semiconductor film has extremely low off-state current and high reliability.

Specifically, various experiments can prove low off-state current of a transistor including a channel formation region in a highly-purified oxide semiconductor film. For example, even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at a voltage (drain voltage) between a source electrode and a drain electrode of 1 to 10 V. In that case, it can be seen that off-state current standardized on the channel width of the transistor is lower than or equal to 100 zA/μm. In addition, a capacitor and a transistor were connected to each other and off-state current was measured using a circuit in which electric charge flowing to or from the capacitor is controlled by the transistor. In the measurement, a highly-purified oxide semiconductor film was used in the channel formation region of the transistor, and the off-state current of the transistor was measured from a change in the amount of electric charge of the capacitor per unit hour. As a result, it can be seen that, in the case where the voltage between the source electrode and the drain electrode of the transistor is 3 V, a lower off-state current of several tens of yoctoamperes per micrometer is obtained. Accordingly, the transistor including the highly-purified oxide semiconductor film in the channel formation region has much lower off-state current than a crystalline silicon transistor.

Note that unless otherwise specified, in this specification, off-state current of an n-channel transistor is current that flows between a source and a drain when the potential of the drain is higher than that of the source or that of a gate while the potential of the gate is 0 V or lower in the case of the potential of the source used as a reference. Alternatively, in this specification, off-state current of a p-channel transistor is current that flows between a source and a drain when the potential of the drain is lower than that of the source or that of a gate while the potential of the gate is 0 V or higher in the case of the potential of the source used as a reference.

In the case where an oxide semiconductor film is used as the semiconductor film, an oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, a CAAC-OS film is deposited by sputtering with a polycrystalline metal oxide target. When ions collide with the target, a crystal region included in the target might be separated from the target along the a-b plane, and a sputtered particle having a plane parallel to the a-b plane (a flat-plate-like sputtered particle or a pellet-like sputtered particle) might be separated from the target. In that case, the flat-plate-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100 to 740° C., preferably 200 to 500° C. By increasing the substrate heating temperature during the deposition, when the flat-plate-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined mole ratio, applying pressure, and performing heat treatment at 1000 to 1500° C. Note that X, Y, and Z are each a given positive number. Here, the predetermined mole ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the mole ratio for mixing powder may be changed as appropriate depending on a target to be formed.

Figure 9:
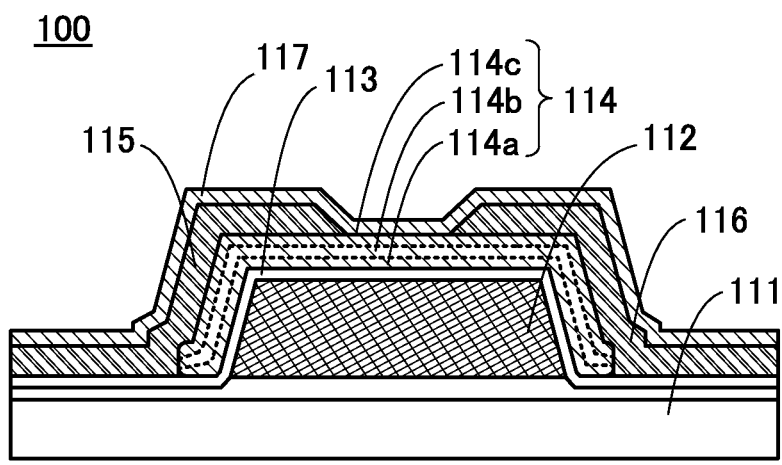
FIG. 9 is a cross-sectional view of a transistor.

The semiconductor film is not necessarily a single oxide semiconductor film, but may be a stack of a plurality of oxide semiconductor films. FIG. 9 illustrates a structure example of a transistor 100 including a semiconductor film which is a stack of three oxide semiconductor films.

The transistor 100 illustrated in FIG. 9 includes, over a substrate 111 having an insulating surface, a conductive film 112 functioning as a gate electrode, a gate insulating film 113 over the conductive film 112, a semiconductor film 114 overlapping with the conductive film 112 with the gate insulating film 113 positioned therebetween, and a conductive film 115 and a conductive film 116 that are in contact with the semiconductor film 114 and function as a source electrode and a drain electrode.

In FIG. 9, an oxide film 117 is provided over the semiconductor film 114, the conductive film 115, and the conductive film 116. In one embodiment of the present invention, the oxide film 117 may be a component of the transistor 100.

In the transistor 100, oxide semiconductor films 114a to 114c are sequentially stacked from the conductive film 112 side functioning as a gate electrode.

Each of the oxide semiconductor films 114a and 114c is an oxide film that contains at least one of metal elements contained in the oxide semiconductor film 114b and in which energy at the bottom of the conduction band is closer to the vacuum level than that in the oxide semiconductor film 114b by higher than or equal to 0.05 eV, 0.07 eV, 0.1 eV, or 0.15 eV and lower than or equal to 2 eV, 1 eV, 0.5 eV, or 0.4 eV. The oxide semiconductor film 114b preferably contains at least indium because carrier mobility is increased.

In the case where the transistor 100 has such a structure, when an electric field is applied to the semiconductor film 114 by application of voltage to the conductive film 112 functioning as a gate electrode, a channel region is formed in the oxide semiconductor film 114b whose energy at the bottom of the conduction band is low in the semiconductor film 114. In other words, the oxide semiconductor film 114c is provided between the oxide semiconductor film 114b and the gate insulating film 113, so that a channel region can be formed in the oxide semiconductor film 114b spaced from the gate insulating film 113.

Since the oxide semiconductor film 114c contains at least one of the metal elements contained in the oxide semiconductor film 114b, interface scattering hardly occurs at an interface between the oxide semiconductor films 114b and 114c. Thus, carriers are not easily inhibited from moving at the interface, which results in an increase in field-effect mobility of the transistor 100.

When an interface state is formed at an interface between the oxide semiconductor films 114b and 114a, a channel region is also formed in a region close to the interface; thus, the threshold voltage of the transistor 100 varies. However, since the oxide semiconductor film 114a contains at least one of the metal elements contained in the oxide semiconductor film 114b, an interface state is hardly formed at the interface between the oxide semiconductor films 114b and 114a. As a result, such a structure can reduce variations in electrical characteristics (e.g., threshold voltage) of the transistor 100.

The plurality of oxide semiconductor films are preferably stacked so that impurities between the oxide semiconductor films do not form an interface state that inhibits carriers from moving at an interface of each film. If impurities exist between the plurality of stacked oxide semiconductor films, the continuity of energy at the bottom of the conduction band between the oxide semiconductor films is lost, and carriers are trapped or lost due to recombination around the interface. A continuous bond (especially, a bond having a U-shaped and well-shaped structure where energy at the bottom of the conduction band is continuously changed between the films) is more likely to be formed in the plurality of oxide semiconductor films containing at least one metal element (main component) in which impurities between the films are reduced than in the plurality of oxide semiconductor films that contain at least one metal element (main component) and are simply stacked.

In order to form such a continuous bond, it is necessary to form films continuously without being exposed to the atmosphere with the use of a multi-chamber deposition apparatus (sputtering apparatus) including a load lock chamber. Each chamber of the sputtering apparatus is preferably evacuated to a high vacuum (to about $1\times10^{-4}$ to $5\times10^{-7}$ Pa) by an adsorption vacuum pump such as a cryopump so that water and the like, which are impurities for an oxide semiconductor, are removed as much as possible. Alternatively, a turbo molecular pump and a cold trap are preferably used in combination to prevent backflow of gas into the chamber through an evacuation system.

To obtain a highly-purified intrinsic oxide semiconductor, not only high vacuum evacuation of the chambers but also high purification of a sputtering gas is important. An oxygen gas or an argon gas used as the gas is highly purified to have a dew point of −40° C. or lower, preferably −80° C. or lower, more preferably −100° C. or lower, so that entry of moisture or the like into the oxide semiconductor film can be prevented as much as possible.

The oxide semiconductor film 114a or 114c may be, for example, an oxide film containing aluminum, silicon, titanium, gallium, germanium, yttrium, zirconium, tin, lanthanum, cerium, or hafnium at a higher atomic ratio than the oxide semiconductor film 114b. Specifically, an oxide film containing the above element at an atomic ratio 1.5 or more times, preferably 2 or more times, more preferably 3 or more times that in the oxide semiconductor film 114b is preferably used as the oxide semiconductor film 114a or 114c. The above element is strongly bonded to oxygen, and thus has a function of inhibiting generation of oxygen vacancies in the oxide film. Accordingly, with such a structure, the oxide semiconductor film 114a or 114c can be an oxide film in which oxygen vacancies are less likely to be generated than in the oxide semiconductor film 114b.

Specifically, in the case where the oxide semiconductor film 114b and the oxide semiconductor film 114a or 114c are formed using an In-M-Zn-based oxide, if the atomic ratio of the oxide semiconductor film 114a or 114c is In:M:Zn=$x_1$:$y_1$:$z_1$ and the atomic ratio of the oxide semiconductor film 114b is In:M:Zn=$x_2$:$y_2$:$z_2$, the atomic ratios may be set so that $y_1/x_1$ is larger than $y_2/x_2$. Note that the element M is a metal element whose bonding strength to oxygen is larger than that of In, and can be Al, Ti, Ga, Y, Zr, Sn, La, Ce, Nd, or Hf, for example. Preferably, the atomic ratios may be set so that $y_1/x_1$ is 1.5 or more times $y_2/x_2$. More preferably, the atomic ratios may be set so that $y_1/x_1$ is 2 or more times $y_2/x_2$. Still more preferably, the atomic ratios may be set so that $y_1/x_1$ is 3 or more times $y_2/x_2$. In the oxide semiconductor film 114b, y is preferably larger than or equal to $x_1$ because the transistor 100 can have stable electrical characteristics. Note that $y_1$ is preferably less than 3 times $x_1$ because the field-effect mobility of the transistor 100 is lowered if $y_1$ is 3 or more times $x_1$.

Figure 15A:
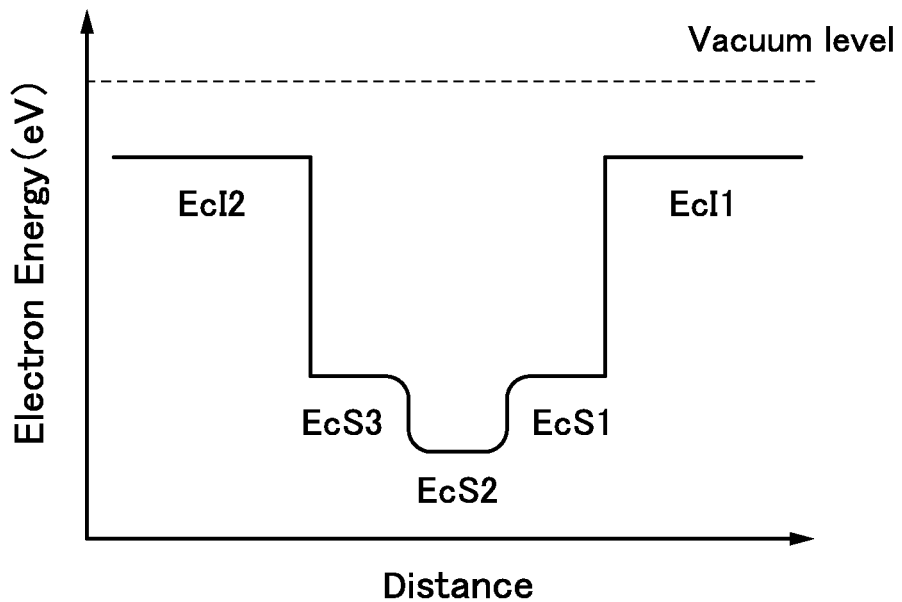
FIGS. 15A and 15B show band structures of a stack of oxides according to one embodiment of the present invention.

FIG. 15A schematically shows part of a band structure at the time when a silicon oxide film is provided to be in contact with the stacked oxide semiconductor films 114a to 114c. In FIG. 15A, the vertical axis represents electron energy (eV), and the horizontal axis represents distance. In addition, EcI1 and EcI2 represent energies at the bottom of the conduction band of the silicon oxide film; EcS1 represents energy at the bottom of the conduction band of the oxide semiconductor film 114a; EcS2 represents energy at the bottom of the conduction band of the oxide semiconductor film 114b; and EcS3 represents energy at the bottom of the conduction band of the oxide semiconductor film 114c.

As shown in FIG. 15A, the energies at the bottom of the conduction band are continuously changed in the oxide semiconductor films 114a to 114c. This is because the compositions of the oxide semiconductor films 114a to 114c are close to each other and oxygen is easily diffused into the oxide semiconductor films 114a to 114c.

Note that although FIG. 15A shows the case where the oxide semiconductor films 114a and 114c have similar energy gaps, the oxide semiconductor films 114a and 114c may have different energy gaps. For example, in the case where EcS1 is higher than EcS3, part of the band structure can be shown as in FIG. 15B. Although not shown in FIGS. 15A and 15B, EcS3 may be higher than EcS1.

Figure 15B:
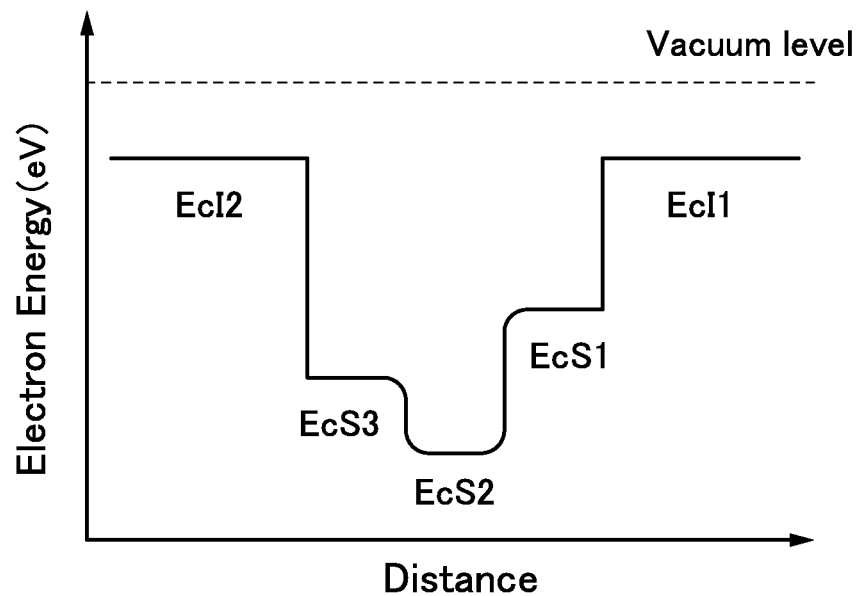

Note that as shown in FIGS. 15A and 15B, trap states resulting from impurities or defects can be formed in the vicinity of the interfaces between the oxide semiconductor films 114a and 114c and insulating films such as a silicon oxide film. The oxide semiconductor films 114a and 114c make the oxide semiconductor film 114b be separated from the trap states. However, when the energy gap between EcS1 or EcS3 and EcS2 is small, an electron in the oxide semiconductor film 114b might reach the trap level over the energy gap. Since the electron is trapped in the trap level, negative fixed electric charge is caused at the interface with the insulating film; thus, the threshold voltage of the transistor is shifted in a positive direction.

Thus, the energy gap between EcS1 and EcS2 and the energy gap between EcS3 and EcS2 are each preferably higher than or equal to 0.1 eV, more preferably higher than or equal to 0.15 eV because the amount of change in threshold voltage of the transistor can be reduced and the transistor can have stable electrical characteristics.

Note that the thickness of each of the oxide semiconductor films 114a and 114c is greater than or equal to 3 nm and less than or equal to 100 nm, preferably greater than or equal to 3 nm and less than or equal to 50 nm. The thickness of the oxide semiconductor film 114b is greater than or equal to 3 nm and less than or equal to 200 nm, preferably greater than or equal to 3 nm and less than or equal to 100 nm, more preferably greater than or equal to 3 nm and less than or equal to 50 nm.

The three oxide semiconductor films (oxide semiconductor films 114a to 114c) can be either amorphous or crystalline. Note that the oxide semiconductor film 114b in which a channel region is formed is preferably crystalline because the transistor 100 can have stable electrical characteristics.

Note that a channel formation region means a region of a semiconductor film of a transistor that overlaps with a gate electrode and is between a source electrode and a drain electrode. Further, a channel region means a region through which current mainly flows in the channel formation region.

For example, in the case where an In—Ga—Zn-based oxide film formed by sputtering is used as each of the oxide semiconductor films 114a and 114c, a target of an In—Ga—Zn-based oxide (In:Ga:Zn=1:3:2 [atomic ratio]) can be used for deposition of the oxide semiconductor films 114a and 114c. The deposition conditions can be, for example, as follows: an argon gas (flow rate: 30 sccm) and an oxygen gas (flow rate: 15 sccm) are used as a deposition gas; pressure is 0.4 Pa; substrate temperature is 200° C.; and DC power is 0.5 kW.

In the case where the oxide semiconductor film 114b is a CAAC-OS film, a target containing a polycrystalline In—Ga—Zn-based oxide (In:Ga:Zn=1:1:1 [atomic ratio]) is preferably used for the deposition. The deposition conditions can be, for example, as follows: an argon gas (flow rate: 30 sccm) and an oxygen gas (flow rate: 15 sccm) are used as a deposition gas; pressure is 0.4 Pa; substrate temperature is 300° C.; and DC power is 0.5 kW.

Note that the transistor 100 illustrated in FIG. 9 may have a structure where the end portion of the semiconductor film 114 is steep or a structure where the end portion of the semiconductor film 114 is rounded.

Note that although FIG. 9 illustrates the semiconductor film 114 formed using a stack of three oxide semiconductor films, the number of stacked oxide semiconductor films may be 2 or more than 3.

Note that in the case where the semiconductor film 114 is formed using a stack of a plurality of oxide semiconductor films, the conductivity of a metal oxide used for the oxide film 117 is lower than the total conductivity of the semiconductor film 114. For example, in the case where an In—Ga—Zn-based oxide is used for the oxide film 117, the metal oxide used for the oxide film 117 preferably has an atomic ratio where an atomic percent of In is lower than that of In in the atomic ratio of the metal oxide used for the semiconductor film 114.

Like the transistor 10, regions that are in contact with the conductive film 115 and the conductive film 116 in the semiconductor film 114 may have n-type conductivity. With such a structure, the mobility and on-state current of the transistor 100 can be increased, so that the semiconductor device including the transistor 100 can operate at high speed. In the case of the transistor 100, the regions having n-type conductivity preferably extend to the oxide semiconductor film 114b serving as a channel region in order that the mobility and on-state current of the transistor 100 can be further increased and the semiconductor device can operate at higher speed.

Method for Forming Semiconductor Device

An example of a method for forming a semiconductor device according to one embodiment of the present is described below.

Figure 10A:
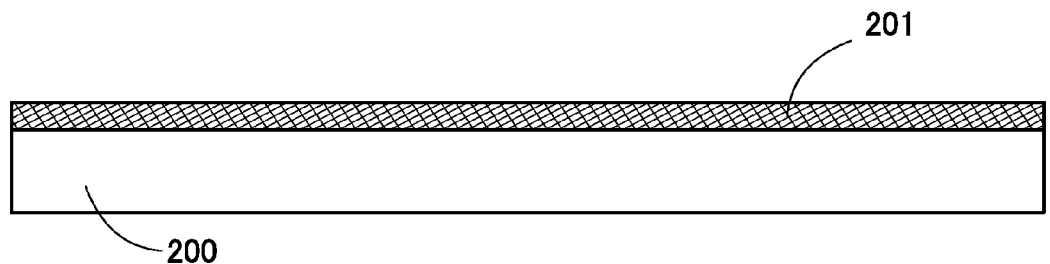
FIGS. 10A to 10D illustrate a method for forming a semiconductor device.

As illustrated in FIG. 10A, a conductive film 201 is formed over a substrate 200.

A substrate having heat resistance high enough to withstand a later manufacturing step is preferably used as the substrate 200, and for example, a glass substrate, a ceramic substrate, a quartz substrate, a sapphire substrate, or the like is used.

A single layer or two or more layers of a film including a conductive material containing one or more kinds of aluminum, titanium, chromium, cobalt, nickel, copper, yttrium, zirconium, molybdenum, ruthenium, silver, tantalum, and tungsten are preferably formed as the conductive film 201. For example, a film in which a copper film is stacked over a tungsten nitride film or a single layer film of tungsten can be formed as the conductive film 201.

Figure 10B:
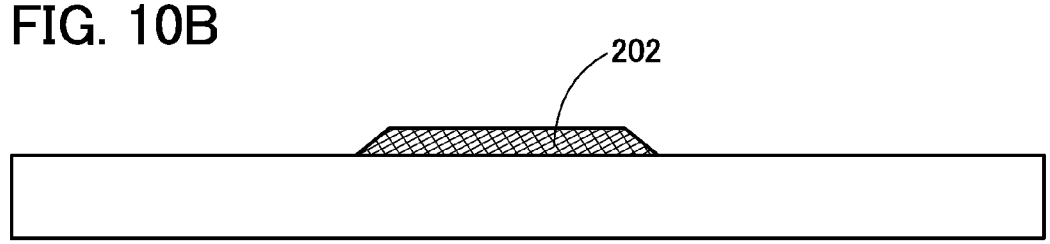

Next, a conductive film 202 functioning as a gate electrode of the transistor is formed by a photolithography process and an etching process. Specifically, a mask formed using a resist (hereinafter referred to as a resist mask) is formed over the conductive film 201 by using a first photomask and then the conductive film 201 is etched, so that a conductive film 202 is formed. Then, the resist mask is removed (see FIG. 10B).

Figure 10C:
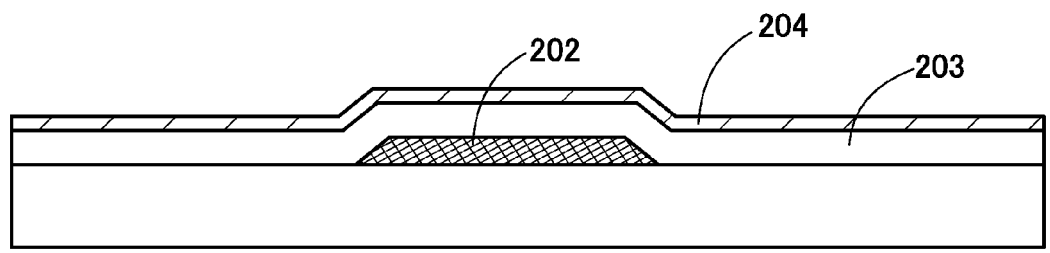

Then, a gate insulating film 203 is formed to cover the conductive film 202, and a semiconductor film 204 is formed over the gate insulating film 203 (see FIG. 10C).

The gate insulating film 203 may be a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

For example, in the case of the gate insulating film 203 having a two-layer structure, a multilayer film including a silicon nitride film as a first layer and a silicon oxide film as a second layer may be used. The silicon oxide film as the second layer can be a silicon oxynitride film. The silicon nitride film as the first layer can be a silicon nitride oxide film.

It is preferable to use a silicon oxide film whose defect density is low as the silicon oxide film. Specifically, a silicon oxide film whose spin density attributed to a signal with a g factor of 2.001 in electron spin resonance (ESR) is lower than or equal to $3\times10^{17}$ spins/cm$^3$, preferably lower than or equal to $5\times10^{16}$ spins/cm$^3$ is used. As the silicon oxide film, a silicon oxide film having excess oxygen is preferably used. As the silicon nitride film, a silicon nitride film from which hydrogen and ammonia are less released is used. The amount of released hydrogen and ammonia is preferably measured by thermal desorption spectroscopy (TDS) analysis.

Figure 10D:
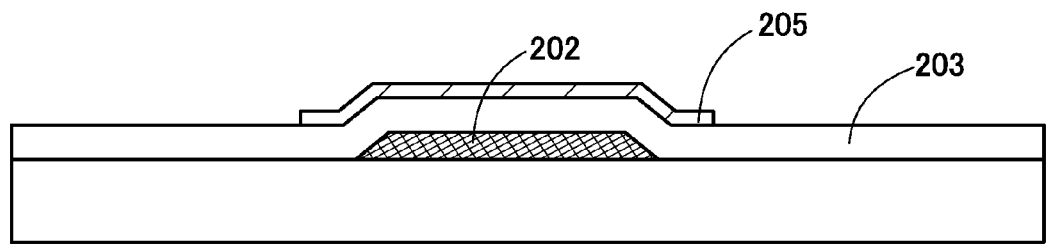

Next, the semiconductor film 204 is processed into a desired shape by a photolithography process and an etching process, so that a semiconductor film 205 is formed (see FIG. 10D). Specifically, a resist mask is formed over the semiconductor film 204 by using a second photomask and the semiconductor film 204 is etched, so that the semiconductor film 205 is formed. Then, the resist mask is removed.

As the oxide semiconductor film 205, the oxide semiconductor described above can be used.

Further, when the oxide semiconductor film used as the semiconductor film 205 contains a large amount of hydrogen, hydrogen and an oxide semiconductor are bonded to each other, so that part of hydrogen serves as a donor and causes an electron (carrier). As a result, the threshold voltage of the transistor is shifted in a negative direction. Thus, it is preferable that after formation of the oxide semiconductor film, dehydration treatment (dehydrogenation treatment) be performed to remove hydrogen or moisture from the oxide semiconductor film so that the oxide semiconductor film contains impurities as little as possible.

Note that oxygen in the oxide semiconductor film is reduced by the dehydration treatment (dehydrogenation treatment) in some cases. Thus, it is preferable that oxygen be added to the oxide semiconductor film to fill oxygen vacancies increased by the dehydration treatment (dehydrogenation treatment).

In this manner, hydrogen or moisture is removed from the oxide semiconductor film by dehydration treatment (dehydrogenation treatment) and oxygen vacancies are filled by oxygen adding treatment, so that the oxide semiconductor film can be an intrinsic (i-type) or substantially intrinsic oxide semiconductor film.

Figure 11A:
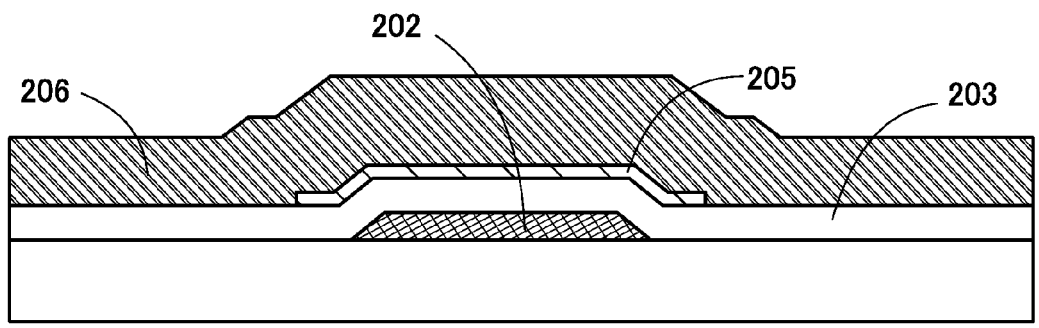
FIGS. 11A to 11C illustrate the method for forming a semiconductor device.

Then, a conductive film 206 is formed over the semiconductor film 205 and the gate insulating film 203. The conductive film 206 can be formed using the same conductive material as the conductive film 201 (see FIG. 11A).

Figure 11B:
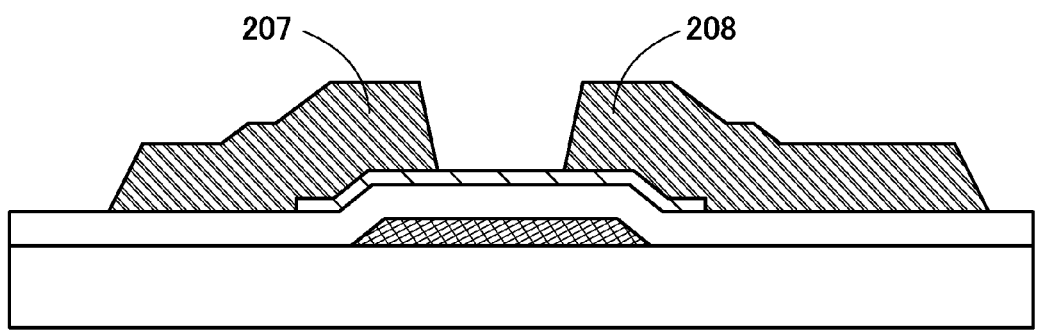

Next, a resist mask is formed over the conductive film 206 and the gate insulating film 203 by using a third photomask. The conductive film 206 is etched using this resist mask, so that a conductive film 207 and a conductive film 208 that are in contact with the semiconductor film 205 are formed (see FIG. 11B).

Figure 11C:
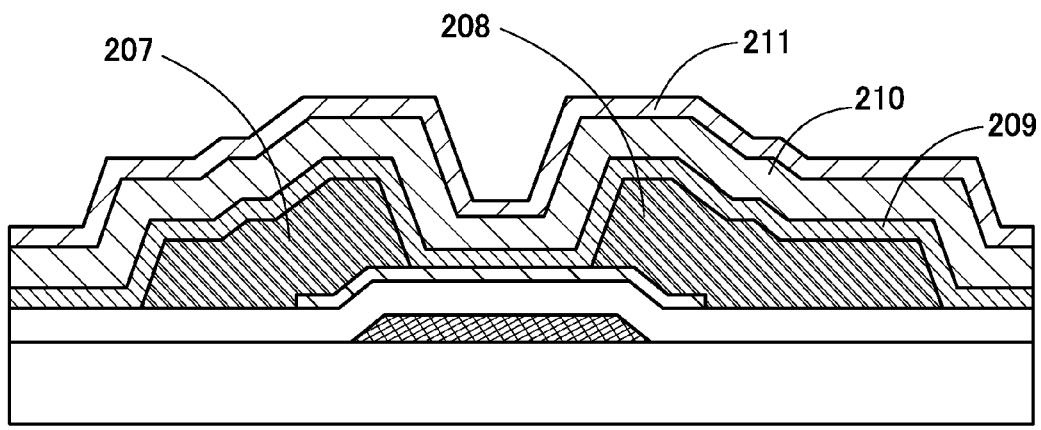

Then, insulating films are formed to cover the entire substrate 200. In FIG. 11C, an oxide film 209, an insulating film 210, and an insulating film 211 are formed.

A metal oxide is preferably used for the oxide film 209. The use of the oxide film 209 having such a structure can space the semiconductor film 205 from the insulating film 210 containing silicon. Thus, in the case where a metal oxide containing indium is used for the semiconductor film 205, silicon, which has higher oxygen bond energy than indium, breaks the bond between indium and oxygen in end portions of the semiconductor film 205 and can prevent generation of oxygen vacancies. As a result, in one embodiment of the present invention, the reliability of the transistor can be further increased.

Specifically, the oxide film 209 can be formed by sputtering using an In—Ga—Zn-based oxide target having a metal atomic ratio of 1:6:4 or 1:3:2.

It is preferable to form the insulating film 211 without exposure to the atmosphere, directly after the insulating film 210 is formed. The insulating film 211 is formed directly after the insulating film 210 is formed, by adjusting at least one of the flow rate of the source gas, the pressure, the high-frequency power, and the substrate temperature without exposure to the atmosphere, so that the concentration of impurities at the interface between the insulating film 210 and the insulating film 211 can be reduced and oxygen contained in the insulating film 211 can move to the oxide semiconductor film 205. Accordingly, the amount of oxygen vacancies in the oxide semiconductor film 205 can be reduced.

As the insulating film 210, a silicon oxide film or a silicon oxynitride film is formed under the following conditions: the substrate placed in a treatment chamber of a plasma-enhanced CVD apparatus that is vacuum-evacuated is held at 180 to 400° C., preferably 200 to 370° C., the pressure in the treatment chamber is 30 to 250 Pa, preferably 40 to 200 Pa with introduction of a source gas into the treatment chamber, and high-frequency power is supplied to an electrode provided in the treatment chamber.

A deposition gas containing silicon and an oxidizing gas are preferably used as the source gases of the insulating film 210. Typical examples of the deposition gas containing silicon include silane, disilane, trisilane, and silane fluoride. As the oxidizing gas, oxygen, ozone, dinitrogen monoxide, nitrogen dioxide, or the like can be used.

Under the above conditions, an oxide insulating film that passes oxygen can be formed as the insulating film 210. With the insulating film 210, damage to the oxide film 209 can be reduced during a later formation process of the insulating film 211.

Note that when the ratio of the amount of the oxidizing gas to the amount of the deposition gas containing silicon is higher than or equal to 100, the hydrogen content in the insulating film 210 can be reduced, and dangling bonds in the insulating film 210 can be reduced. Oxygen that moves from the insulating film 211 might be captured by the dangling bond in the insulating film 210. Thus, oxygen contained in the insulating film 211 containing oxygen at a higher proportion than the stoichiometric composition can efficiently move to the semiconductor film 205 and oxygen vacancies in the semiconductor film 205 can be compensated. As a result, the amount of hydrogen entering the semiconductor film 205 can be reduced, and oxygen vacancies in the semiconductor film 205 can be reduced. Consequently, a negative shift in threshold voltage of the transistor can be reduced, and leakage current between a source and a drain of the transistor can be reduced; accordingly, the electrical characteristics of the transistor can be improved.

In one embodiment of the present invention, as the insulating film 210, a 50-nm-thick silicon oxynitride film is formed by plasma-enhanced CVD under the following conditions: silane with a flow rate of 20 sccm and dinitrogen monoxide with a flow rate of 3000 sccm are used as the source gases, the pressure in the treatment chamber is 40 Pa, the substrate temperature is 220° C., and a high-frequency power of 100 W is supplied to parallel plate electrodes with a high-frequency power supply of 27.12 MHz. Note that a plasma-enhanced CVD apparatus is a parallel plate plasma-enhanced CVD apparatus in which the electrode area is 6000 cm$^2$, and power per unit area (power density) into which supplied power is converted is $1.6 \times 10^{-2}$ W/cm$^2$. Under the above conditions, a silicon oxynitride film that passes oxygen can be formed.

As the insulating film 211, a silicon oxide film or a silicon oxynitride film is formed under the following conditions: the substrate placed in a treatment chamber of the plasma-enhanced CVD apparatus that is vacuum-evacuated is held at 180 to 260° C., preferably 180 to 230° C., the pressure is 100 to 250 Pa, preferably 100 to 200 Pa with introduction of a source gas into the treatment chamber, and a high-frequency power of 0.17 to 0.5 W/cm$^2$, preferably 0.25 to 0.35 W/cm$^2$ is supplied to an electrode provided in the treatment chamber.

As the deposition conditions of the insulating film 211, the high-frequency power having the power density is supplied to the treatment chamber having the pressure, so that the degradation efficiency of the source gas in plasma is increased, oxygen radicals are increased, and oxidation of the source gas is promoted. Thus, the oxygen content in the insulating film 211 becomes higher than that in the stoichiometric composition. However, in the case where the substrate temperature is within the temperature range, a bond between silicon and oxygen is weak; thus, part of oxygen is released by heating. Accordingly, it is possible to form an oxide insulating film which contains oxygen at a higher proportion than the stoichiometric composition and from which part of oxygen is released by heating. Further, the insulating film 210 is provided over the oxide film 209. Accordingly, in the process of forming the insulating film 211, the insulating film 210 serves as a protective film of the oxide film 209. Consequently, the insulating film 211 can be formed using the high-frequency power having high power density while damage to the oxide film 209 is reduced.

In one embodiment of the present invention, as the insulating film 211, a 400-nm-thick silicon oxynitride film is formed by plasma-enhanced CVD under the following conditions: silane with a flow rate of 160 sccm and dinitrogen monoxide with a flow rate of 4000 sccm are used as the source gas, the pressure in the treatment chamber is 200 Pa, the substrate temperature is 220° C., and a high-frequency power of 1500 W is supplied to parallel plate electrodes with a high-frequency power supply of 27.12 MHz. Note that a plasma-enhanced CVD apparatus is a parallel plate plasma-enhanced CVD apparatus in which the electrode area is 6000 cm$^2$, and power per unit area (power density) into which supplied power is converted is $2.5 \times 10^{-1}$ W/cm$^2$.

Then, it is preferable that heat treatment be performed at least after formation of the insulating film 211 so that oxygen contained in the insulating film 210 or the insulating film 211 moves to the oxide film 209 and the semiconductor film 205 to fill oxygen vacancies in the oxide film 209 and the semiconductor film 205. Note that the heat treatment can be performed as heat treatment for dehydration or dehydrogenation of the semiconductor film 205.

Figure 12A:
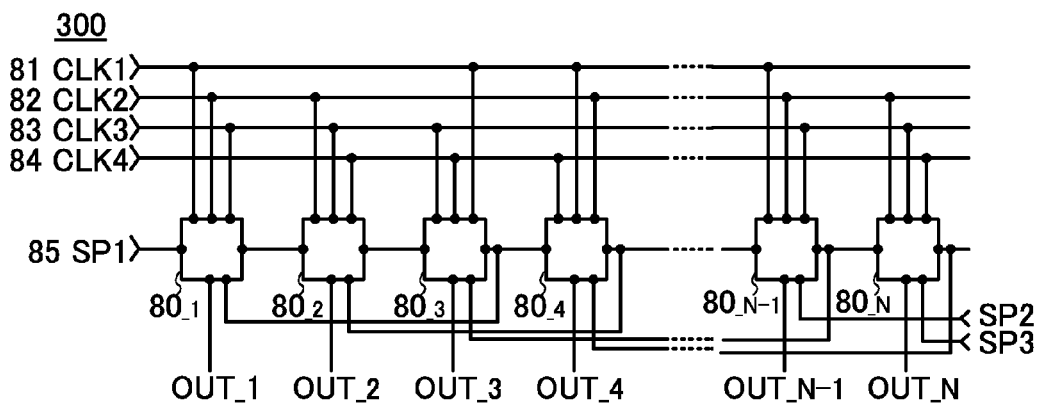
FIGS. 12A to 12C illustrate structures of a shift register and a sequential logic circuit.
Figure 12B:
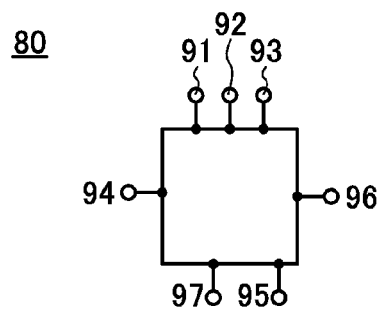
Figure 12C:
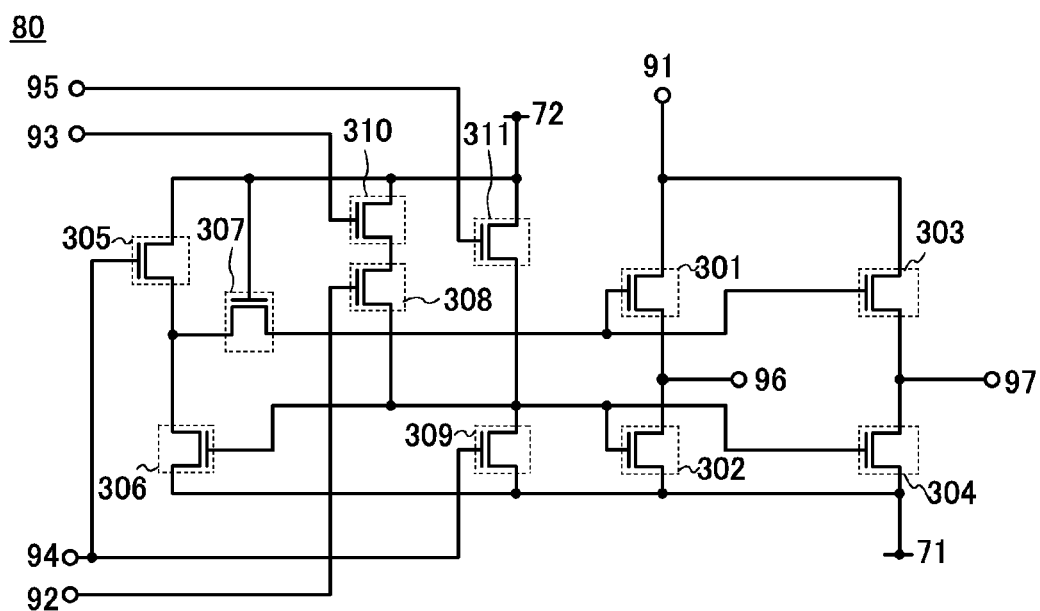

Circuit Structure Examples of Semiconductor Device According to One Embodiment of the Present Invention Next, structure examples of circuits included in a semiconductor device according to one embodiment of the present invention are described. FIGS. 12A to 12C illustrate structure examples of a sequential logic circuit 80 and a shift register 300 including the sequential logic circuit 80.

The shift register 300 illustrated in FIG. 12A includes a plurality of sequential logic circuits 80 (a first sequential logic circuit $80_{\_1}$ to an N-th sequential logic circuit $80_{\_N}$) and wirings 81 to 84 having a function of transmitting clock signals CLK. A clock signal CLK1 is input to the wiring 81. A clock signal CLK2 is input to the wiring 82. A clock signal CLK3 is input to the wiring 83. A clock signal CLK4 is input to the wiring 84.

A clock signal is a signal that alternates between a high-level potential (H) and a low-level potential (L) at regular intervals. In FIG. 12A, the clock signals CLK1 to CLK4 are delayed by ¼ period sequentially. In the circuits illustrated in FIGS. 12A to 12C, the clock signals are utilized to control the sequential logic circuits 80. Note that clock signals may also be input to the sequential logic circuits 80.

The first sequential logic circuit 80$_{-1}$ to the N-th sequential logic circuit 80$_{-N}$ each include a terminal 91, a terminal 92, a terminal 93, a terminal 94, a terminal 95, a terminal 96, and a terminal 97 (see FIG. 12B).

The terminal 91, the terminal 92, and the terminal 93 are connected to any of the wirings 81 to 84. For example, in the first sequential logic circuit 80$_{-1}$, the terminal 91 is connected to the wiring 81, the terminal 92 is connected to the wiring 82, and the terminal 93 is connected to the wiring 83. In the second sequential logic circuit 80$_{-2}$, the terminal 91 is connected to the wiring 82, the terminal 92 is connected to the wiring 83, and the terminal 93 is connected to the wiring 84. Note that although FIG. 12A illustrates the case where wirings connected to the N-th sequential logic circuit 80$_{-N}$ are the wiring 82, the wiring 83, and the wiring 84, the wirings connected to the N-th sequential logic circuit 80$_{-N}$ vary depending on the value of N.

In the k-th sequential logic circuit (k is a natural number of 3 or more and N or less) of the shift register 300 in one embodiment of the present invention, the terminal 94 is connected to the terminal 96 of the (k−1)th sequential logic circuit, the terminal 95 is connected to the terminal 96 of the (k+2)th sequential logic circuit, the terminal 96 is connected to the terminal 94 of the (k+1)th sequential logic circuit and the terminal 95 of the (k−2)th sequential logic circuit, and the terminal 97 outputs signals to OUT_k.

In addition, a start pulse SP1 is input from a wiring 85 to the terminal 94 in the first sequential logic circuit 80$_{-1}$. A start pulse SP2 is input to the terminal 95 in the (N−1)th sequential logic circuit 80$_{-(N-1)}$. A start pulse SP3 is input to the terminal 95 in the N-th sequential logic circuit 80$_{-N}$. Note that the start pulse SP2 and the start pulse SP3 may be input from the outside or generated inside the circuit.

Next, specific structures of the first sequential logic circuit 80$_{-1}$ to the N-th sequential logic circuit 80$_{-N}$ are described.

Each of the first sequential logic circuit 80$_{-1}$ to the N-th sequential logic circuit 80$_{-N}$ includes transistors 301 to 311, as illustrated in FIG. 12C. Note that in the following description, a gate of a transistor, one of a source and a drain, and the other of the source and the drain are referred to as a gate terminal, a first terminal, and a second terminal, respectively.

Note that in this specification, the term "connection" means electrical connection and corresponds to a state where current, voltage, or a potential can be supplied or transmitted. Accordingly, a connection state does not always mean a direct connection state but includes an indirect connection state through a circuit element such as a wiring, a resistor, a diode, or a transistor so that current, voltage, or a potential can be supplied or transmitted. Even when independent components are connected to each other in a circuit diagram, there is the case where one conductive film has functions of a plurality of components, such as the case where part of a wiring functions as an electrode. The term "connection" in this specification also means such a case where one conductive film has functions of a plurality of components.

A source of a transistor means a source region that is part of a semiconductor film or a source electrode that is connected to the semiconductor film. Similarly, a drain of a transistor means a drain region that is part of the semiconductor film or a drain electrode that is connected to the semiconductor film. A gate means a gate electrode.

The terms "source" and "drain" of a transistor interchange with each other depending on the polarity of the transistor or levels of potentials applied to terminals. In general, in an n-channel transistor, a terminal to which a low potential is applied is called a source, and a terminal to which a high potential is applied is called a drain. Further, in a p-channel transistor, a terminal to which a low potential is applied is called a drain, and a terminal to which a high potential is applied is called a source. In this specification, although the connection relation of the transistor is described assuming that the source and the drain are fixed in some cases for convenience, actually, the names of the source and the drain interchange with each other depending on the relation of the potentials.

The structure of the sequential logic circuit illustrated in FIG. 12C is described.

A first terminal of the transistor 301 is connected to the terminal 91, a second terminal of the transistor 301 is connected to the terminal 96, and a gate terminal of the transistor 301 is connected to a second terminal of the transistor 307. A first terminal of the transistor 302 is connected to the terminal 96, a second terminal of the transistor 302 is connected to a wiring 71, and a gate terminal of the transistor 302 is connected to a second terminal of the transistor 308. A first terminal of the transistor 303 is connected to the terminal 91, a second terminal of the transistor 303 is connected to the terminal 97, and a gate terminal of the transistor 303 is connected to the second terminal of the transistor 307. A first terminal of the transistor 304 is connected to the terminal 97, a second terminal of the transistor 304 is connected to the wiring 71, and a gate terminal of the transistor 304 is connected to the second terminal of the transistor 308. A first terminal of the transistor 305 is connected to a wiring 72, a second terminal of the transistor 305 is connected to a first terminal of the transistor 306 and a first terminal of the transistor 307, and a gate terminal of the transistor 305 is connected to the terminal 94. The first terminal of the transistor 306 is connected to the second terminal of the transistor 305 and the first terminal of the transistor 307, a second terminal of the transistor 306 is connected to the wiring 71, and a gate terminal of the transistor 306 is connected to the second terminal of the transistor 308. The first terminal of the transistor 307 is connected to the second terminal of the transistor 305 and the first terminal of the transistor 306, the second terminal of the transistor 307 is connected to the gate terminal of the transistor 301 and the gate terminal of the transistor 303, and a gate terminal of the transistor 307 is connected to the wiring 72. A first terminal of the transistor 308 is connected to a second terminal of the transistor 310, the second terminal of the transistor 308 is connected to the gate terminal of the transistor 302, the gate terminal of the transistor 304, and the gate terminal of the transistor 306, and a gate terminal of the transistor 308 is connected to the terminal 92. A first terminal of the transistor 309 is connected to the second terminal of the transistor 308, a second terminal of the transistor 309 is connected to the wiring 71, and a gate terminal of the transistor 309 is connected to the terminal 94. A first terminal of the transistor 310 is connected to the wiring 72, the second terminal of the transistor 310 is connected to the first terminal of the transistor 308, and a gate terminal of the transistor 310 is connected to the terminal 93. A first terminal of the transistor 311 is connected to the wiring 72, a second terminal of the transistor 311 is connected to the second terminal of the transistor 308, and a gate terminal of the transistor 311 is connected to the terminal 95.

One embodiment of the present invention is not limited to the above structure of the sequential logic circuit that is just an example.

In the case where the sequential logic circuit 80 in FIG. 12C is the first sequential logic circuit 80_1 in FIG. 12A, the clock signal CLK1, the clock signal CLK2, the clock signal CLK3, the start pulse SP1, and an output signal (SROUT_3) of the third sequential logic circuit 80_3 are input to the terminal 91, the terminal 92, the terminal 93, the terminal 94, and the terminal 95, respectively. An output signal (SROUT_1) of the first sequential logic circuit 80_1 is output from the terminal 96 to the terminal 94 of the second sequential logic circuit 80_2, and an output signal OUT_1 is output from the terminal 97.

A second potential VSS is applied to the wiring 71, and a first potential VDD is applied to the wiring 72.

In the shift register 300 including the sequential logic circuits 80 in FIG. 12C, desired pulses can be sequentially obtained as output signals OUT_1 to OUT_N in response to the first potential VDD, the second potential VSS, the clock signals CLK1 to CLK4, the start pulse SP, and output signals SROUT_1 to SROUT_N.

In the case of a circuit including transistors having the same conductivity type as illustrated in the sequential logic circuit 80 in FIG. 12C, the potentials of nodes and terminals of the circuit are lowered by the threshold voltage of the transistor. Specifically, in FIG. 12C, when the transistor 303 is on, a potential lower than a high-level potential (H) of a clock signal input to the terminal 91 by the threshold voltage of the transistor 303 is applied to the terminal 97. Thus, in the case of the circuit including transistors having the same conductivity type, it is important to lower the threshold voltage of a transistor so that the transistor can be normally off.

In one embodiment of the present invention, each of the transistor 10, the transistor 30, the transistor 40, and the transistor 100 has an initial value of threshold voltage such that each transistor is normally off, and the amount of change in threshold voltage in a positive direction can be reduced. Accordingly, by using the transistor 10, the transistor 30, the transistor 40, or the transistor 100 as each of the transistors 301 to 311, the reliability of the sequential logic circuit 80 can be increased.

In particular, in the case where the transistors 301 to 311 are n-channel transistors, a malfunction is likely to occur when the threshold voltages of the transistor 303 for inputting a high-level output signal to the terminal 97, the transistor 301 for inputting a high-level output signal to the terminal 96, and the transistor 305 for applying a high-level potential to the gate terminal of each of the transistor 303 and the transistor 301 are greatly shifted in a positive direction. For example, the sequential logic circuit 80 does not operate correctly or high-level potentials output from the terminal 96 and the terminal 97 become lower than desired potentials even when the sequential logic circuit 80 operates correctly. Accordingly, the use of the transistor 10, the transistor 30, the transistor 40, or the transistor 100 as at least each of the transistor 303, the transistor 301, and the transistor 305 is effective in ensuring the reliability of the sequential logic circuit 80.

Note that in one embodiment of the present invention, in the structure of the sequential logic circuit illustrated in FIG. 12C, a back gate is provided for each of the transistors. The back gate may be floating or may be supplied with a potential from another element. In the latter case, potentials at the same level may be applied to a normal gate (front gate) and the back gate, or a fixed potential such as a ground potential may be applied only to the back gate. By controlling the potential applied to the back gate, the threshold voltage of the transistor can be controlled. By providing the back gate, a channel formation region is enlarged and drain current can be increased. Further, the back gate facilitates formation of a depletion layer in the semiconductor film, which results in lower subthreshold swing.

Structure Example of Semiconductor Display Device

In one embodiment of the present invention, a structure example of a semiconductor display device that is one aspect of a semiconductor device of the present invention is described.

Figure 13A:
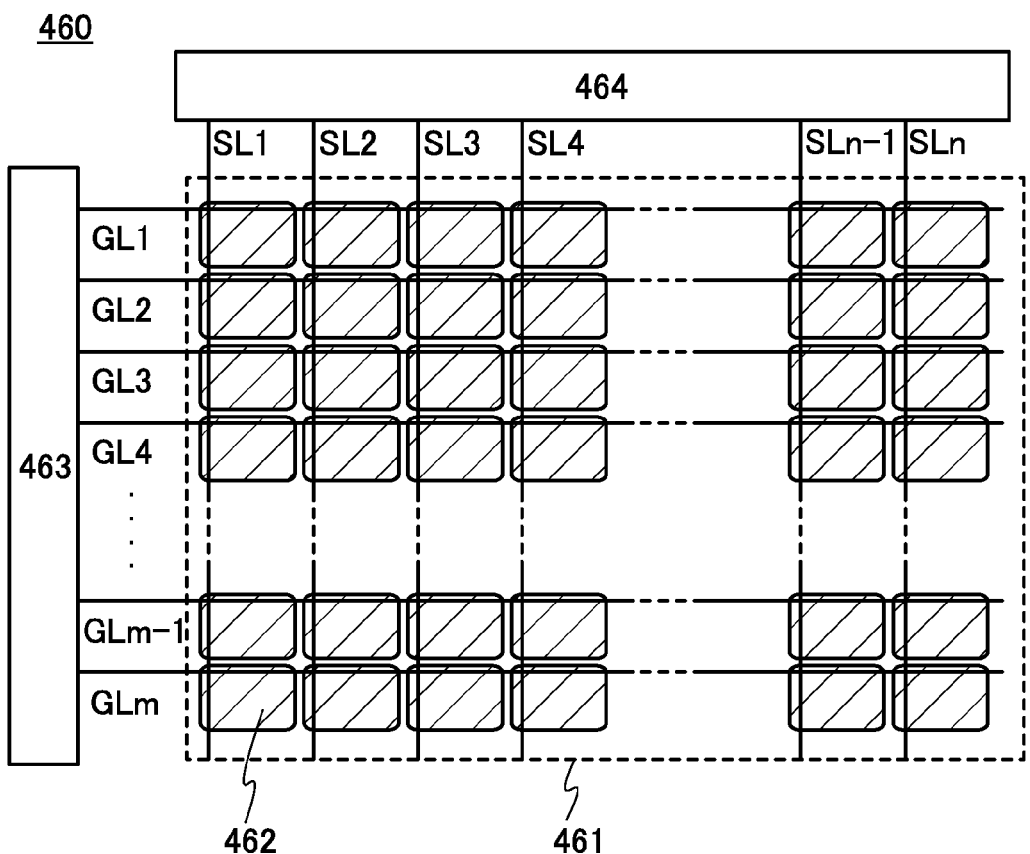
FIGS. 13A to 13C illustrate a structure of a semiconductor display device.

In a panel 460 in FIG. 13A, a plurality of pixels 462, scan lines GL (GL1 to GLm (m is a natural number)) for selecting the pixels 462 row by row, and signal lines SL (SL1 to SLn (n is a natural number)) for supplying image signals to the selected pixels 462 are provided in a pixel portion 461. Input of signals to the scan lines GL is controlled by a scan line driver circuit 463. Input of image signals to the signal lines SL is controlled by a signal line driver circuit 464. Each of the plurality of pixels 462 is connected to at least one of the scan lines GL and at least one of the signal lines SL.

Note that the kinds and number of the lines in the pixel portion 461 can be determined by the structure, number, and position of the pixels 462. Specifically, in the case of the pixel portion 461 in FIG. 13A, the pixels 462 are arranged in a matrix of n columns×m rows, and the signal lines SL1 to SLn and the scan lines GL1 to GLm are provided in the pixel portion 461.

The sequential logic circuit 80 and the shift register 300 illustrated in FIGS. 12A to 12C can be used for the scan line driver circuit 463 or the signal line driver circuit 464. The use of the sequential logic circuit 80 and the shift register 300 including the transistor 10, the transistor 30, the transistor 40, or the transistor 100 for the scan line driver circuit 463 or the signal line driver circuit 464 increases the reliability of the semiconductor display device.

Figure 13B:
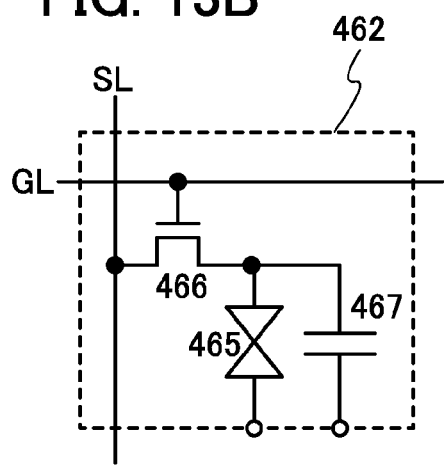

FIG. 13B illustrates a structure example of the pixel 462. Each of the pixels 462 includes a liquid crystal element 465, a transistor 466 controlling supply of an image signal to the liquid crystal element 465, and a capacitor 467 for holding voltage across a pixel electrode and a common electrode of the liquid crystal element 465. The liquid crystal element 465 includes the pixel electrode, the common electrode, and a liquid crystal layer that is provided between the pixel electrode and the common electrode, is supplied with voltage, and contains a liquid crystal material.

The transistor 466 controls whether to apply the potential of the signal line SL to the pixel electrode of the liquid crystal element 465. A predetermined potential is applied to the common electrode of the liquid crystal element 465.

The specific connection relation between the transistor 466 and the liquid crystal element 465 is described below. In FIG. 13B, a gate electrode of the transistor 466 is connected to any one of the scan lines GL1 to GLm. One of a source electrode and a drain electrode of the transistor 466 is connected to any one of the signal lines SL1 to SLn. The other of the source electrode and the drain electrode of the transistor 466 is connected to the pixel electrode of the liquid crystal element 465.

In FIG. 13B, one transistor 466 is used in the pixel 462 as a switch controlling input of an image signal to the pixel 462; however, a plurality of transistors functioning as one switch may be used in the pixel 462.

In one embodiment of the present invention, the use of the transistor 10, the transistor 30, the transistor 40, or the transistor 100 as the transistor 466 increases the reliability of the semiconductor display device. A transistor including an oxide semiconductor in a semiconductor film has extremely low off-state current; thus, when such a transistor is used as the transistor 466, leakage of electric charge through the transistor 466 can be prevented. Thus, the potential of an image signal that is applied to the liquid crystal element 465 and the capacitor 467 can be held more reliably. Accordingly, changes in transmittance of the liquid crystal element 465 due to leakage of electric charge in one frame period are prevented, so that the quality of an image to be displayed can be improved. In addition, when the off-state current of the transistor 466 is low, leakage of electric charge through the transistor 466 can be prevented; thus, the area of the capacitor 467 can be made small. Consequently, the transmittance of the panel 460 is increased, so that loss of light supplied from a light supply portion such as a backlight or a frontlight in the panel 460 and the power consumption of a liquid crystal display device can be reduced. Alternatively, in a period during which a still image is displayed, supply of power supply potentials or signals to the scan line driver circuit 463 and the signal line driver circuit 464 may be stopped. With such a structure, the number of times of writing image signals to the pixel portion 461 can be decreased, so that the power consumption of the semiconductor display device can be reduced.

FIG. 13B illustrates another example of the pixel 462. The pixel 462 includes a transistor 470 controlling input of an image signal to the pixel 462, a light-emitting element 473, a transistor 471 controlling the value of current supplied to the light-emitting element 473 in response to an image signal, and a capacitor 472 for holding the potential of an image signal.

The potential of one of an anode and a cathode of the light-emitting element 473 is controlled in response to an image signal input to the pixel 462. A predetermined potential is applied to the other of the anode and the cathode of the light-emitting element 473. The luminance of the light-emitting element 473 is determined by a potential difference between the anode and the cathode. In each of the plurality of pixels 462 included in the pixel portion, the luminance of the light-emitting element 473 is adjusted in response to an image signal containing image information, so that an image is displayed on the pixel portion 461.

Next, connection of the transistor 470, the transistor 471, the capacitor 472, and the light-emitting element 473 that are included in the pixel 462 is described.

One of a source electrode and a drain electrode of the transistor 470 is connected to the signal line SL, and the other of the source electrode and the drain electrode of the transistor 470 is connected to a gate electrode of the transistor 471. A gate electrode of the transistor 470 is connected to the scan line GL. One of a source electrode and a drain electrode of the transistor 471 is connected to a power supply line VL, and the other of the source electrode and the drain electrode of the transistor 471 is connected to the light-emitting element 473. Specifically, the other of the source electrode and the drain electrode of the transistor 471 is connected to one of the anode and the cathode of the light-emitting element 473. A predetermined potential is applied to the other of the anode and the cathode of the light-emitting element 473.

Figure 13C:
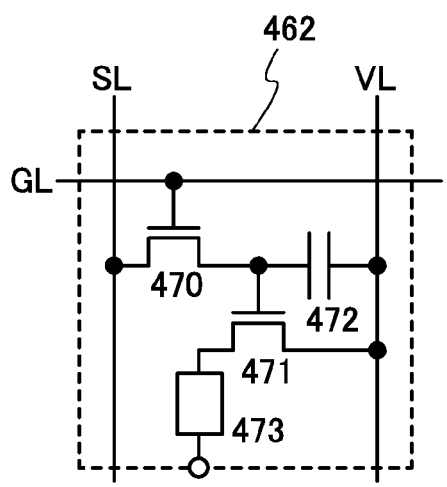

Note that in FIG. 13C, the pixel 462 includes the capacitor 472. However, for example, in the case where gate capacitance generated between the gate electrode and a semiconductor film of the transistor 470 or gate parasitic capacitance is high, i.e., the case where the potential of an image signal can be sufficiently held by another capacitor, the capacitor 472 is not necessarily provided in the pixel 462.

Examples of the light-emitting element 473 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers provided between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 473. Electroluminescence includes luminescence (fluorescence) at the time of returning from a singlet-excited state to a ground state and luminescence (phosphorescence) at the time of returning from a triplet-excited state to a ground state.

Structure Example of Electronic Device Including Semiconductor Device

A semiconductor device according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the semiconductor device according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 14A to 14F illustrate specific examples of these electronic devices.

Figure 14A:
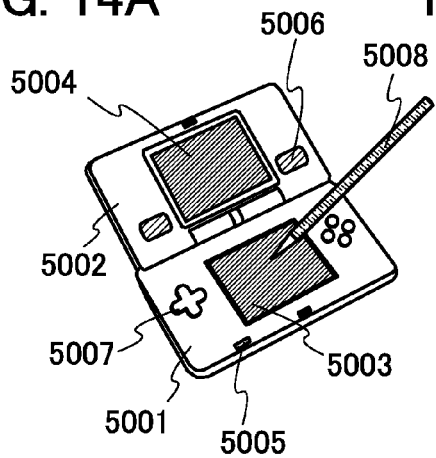
FIGS. 14A to 14F illustrate electronic devices.

FIG. 14A illustrates a portable game machine, which includes a housing 5001, a housing 5002, a display portion 5003, a display portion 5004, a microphone 5005, speakers 5006, an operation key 5007, a stylus 5008, and the like. It is possible to use the semiconductor device according to one embodiment of the present invention as the display portion 5003 or 5004 or another circuit. Note that although the portable game machine in FIG. 14A has the two display portions 5003 and 5004, the number of display portions included in the portable game machine is not limited thereto.

Figure 14B:
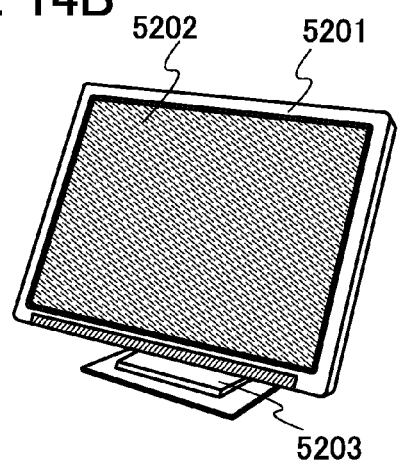

FIG. 14B illustrates a display device, which includes a housing 5201, a display portion 5202, a support 5203, and the like. It is possible to use the semiconductor device according to one embodiment of the present invention as the display portion 5202 or another circuit. Note that the display device means all display devices for displaying information, such as display devices for personal computers, for receiving TV broadcast, and for displaying advertisements.

Figure 14C:
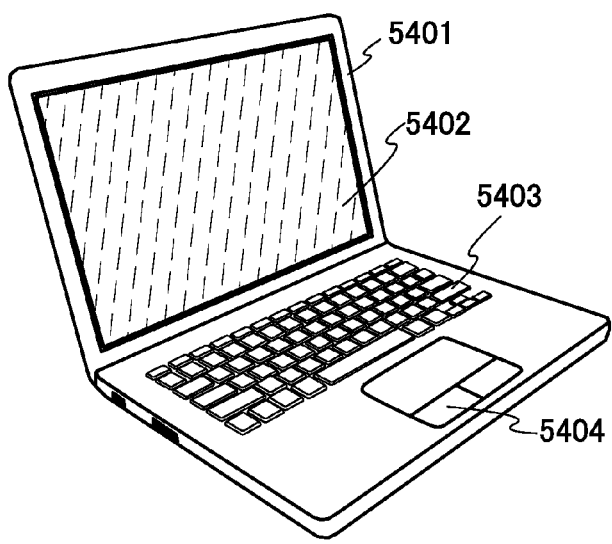

FIG. 14C illustrates a laptop, which includes a housing 5401, a display portion 5402, a keyboard 5403, a pointing device 5404, and the like. It is possible to use the semiconductor device according to one embodiment of the present invention as the display portion 5402 or another circuit.

Figure 14D:
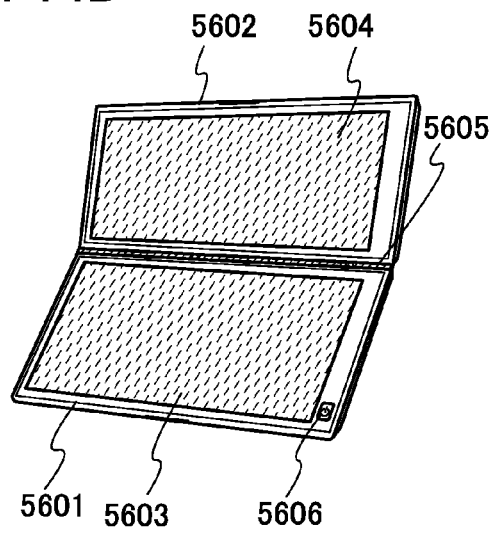

FIG. 14D illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. It is possible to use the semiconductor device according to one embodiment of the present invention as the first display portion 5603, the second display portion 5604, or another circuit. A semiconductor device with a position input function may be used as at least one of the first display portion 5603 and the second display portion 5604. Note that the position input function can be added by providing a touch panel in a semiconductor device. Alternatively, the position input function can be added by providing a photoelectric conversion element called a photosensor in a pixel portion of a semiconductor device.

Figure 14E:
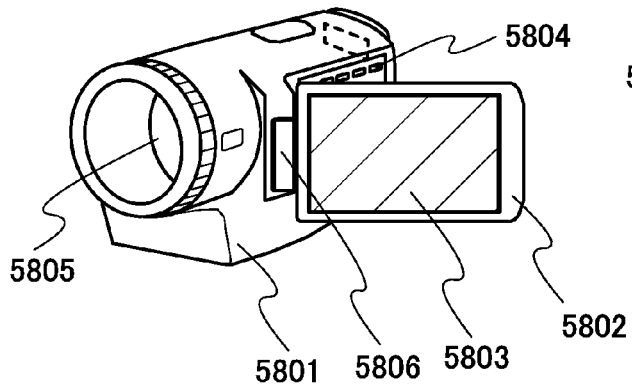

FIG. 14E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806. It is possible to use the semiconductor device according to one embodiment of the present invention as the display portion 5803 or another circuit.

Figure 14F:
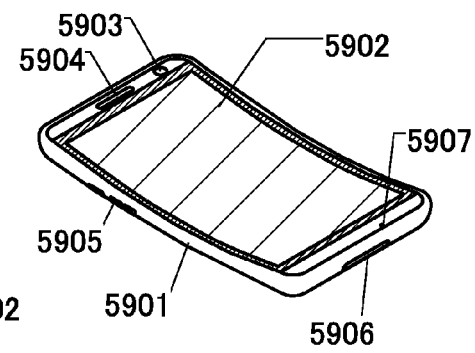

FIG. 14F illustrates a cellular phone, which includes a display portion 5902, a microphone 5907, a speaker 5904, a camera 5903, an external connection port 5906, and an operation button 5905 in a housing 5901. It is possible to use the semiconductor device according to one embodiment of the present invention as a circuit of the cellular phone. When a liquid crystal display device that is one of semiconductor devices according to one embodiment of the present invention is provided over a flexible substrate, the liquid crystal display device can be used as the display portion 5902 having a curved surface, as illustrated in FIG. 14F.

This application is based on Japanese Patent Application serial No. 2012-251935 filed with Japan Patent Office on Nov. 16, 2012, the entire contents of which are hereby incorporated by reference.

What is claimed is:
1. A semiconductor device comprising:
a gate electrode;
a gate insulating film over the gate electrode;
a first oxide semiconductor film overlapping with the gate electrode;
a source electrode and a drain electrode being in contact with the first oxide semiconductor film; and
an oxide film over the first oxide semiconductor film, the source electrode, and the drain electrode,
wherein the gate insulating film is between the first oxide semiconductor film and the gate electrode,
wherein an end portion of the first oxide semiconductor film is spaced from an end portion of the source electrode or the drain electrode in a channel width direction,
wherein a width of the first oxide semiconductor film in the channel width direction is larger than a width of the source electrode or the drain electrode in the channel width direction,
wherein the first oxide semiconductor film and the oxide film each comprise a metal oxide comprising In, and
wherein a conductivity of the oxide film is lower than a conductivity of the first oxide semiconductor film.

2. The semiconductor device according to claim 1,
wherein directions of a-axes and b-axes are different between crystal parts in the first oxide semiconductor film, and
wherein c-axes of the crystal parts are aligned in a direction parallel to a normal vector of a formation surface or a normal vector of a top surface of the oxide semiconductor film.

3. The semiconductor device according to claim 1, further comprising:
a substrate,
wherein the gate electrode is over the substrate.

4. The semiconductor device according to claim 1, further comprising:
a second oxide semiconductor film being in contact with the first oxide semiconductor film; and
a third oxide semiconductor film being in contact with the first oxide semiconductor film,
wherein the first oxide semiconductor film is between the second oxide semiconductor film and the third oxide semiconductor film, and
wherein an energy level of a bottom of a conductive band of the first oxide semiconductor film is lower than an energy level of a bottom of a conductive band of the second oxide semiconductor film and an energy level of a bottom of a conductive band of the third oxide semiconductor film.

5. The semiconductor device according to claim 4,
wherein the energy level of the bottom of the conductive band of the first oxide semiconductor film is continuously changed to the energy level of the bottom of the conductive band of the second oxide semiconductor film at an interface between the second oxide semiconductor film and the first oxide semiconductor film, and
wherein the energy level of the bottom of the conductive band of the third oxide semiconductor film is continuously changed to the energy level of the bottom of the conductive band of the first oxide semiconductor film at an interface between the third oxide semiconductor film and the first oxide semiconductor film.

6. The semiconductor device according to claim 1, wherein the gate insulating film comprises a silicon oxide film including excess oxygen.

7. The semiconductor device according to claim 6, wherein the silicon oxide film whose spin density attributed to a signal with a g factor of 2.001 in ESR is less than or equal to $3 \times 10^{17}$ spins/cm$^3$.

8. The semiconductor device according to claim 1,
wherein the gate insulating film comprises a silicon oxide film including excess oxygen and a silicon nitride film, and
wherein the silicon oxide film is over the silicon nitride film.

9. The semiconductor device according to claim 8, wherein the silicon oxide film whose spin density attributed to a signal with a g factor of 2.001 in ESR is less than or equal to $3 \times 10^{17}$ spins/cm$^3$.

10. An electronic device comprising the semiconductor device according to claim 1.

11. The semiconductor device according to claim 1, wherein the metal oxide further comprises Ga and Zn.

12. The semiconductor device according to claim 1, wherein each of the source electrode and the drain electrode are overlapped with the gate electrode.

13. A semiconductor device comprising:
a substrate;
a gate electrode over the substrate;
a gate insulating film;
a semiconductor film overlapping with the gate electrode;
a source electrode and a drain electrode; and
an oxide film over the semiconductor film, the source electrode, and the drain electrode,
wherein the gate insulating film is between the semiconductor film and the gate electrode,
wherein each of the source electrode and the drain electrode comprises a plurality of convex portions in an end portion,
wherein the plurality of convex portions are each partly in contact with the semiconductor film,
wherein an end portion of the semiconductor film is spaced from the plurality of convex portions in a region overlapping with the semiconductor film in a channel width direction,
wherein the semiconductor film comprises an oxide semiconductor, and
wherein the semiconductor film and the oxide film each comprise a metal oxide comprising In.

14. The semiconductor device according to claim 13, wherein the semiconductor film comprises Ga and Zn.

15. The semiconductor device according to claim 13, wherein a conductivity of the oxide film is lower than a conductivity of the semiconductor film.

16. The semiconductor device according to claim 13, wherein directions of a-axes and b-axes are different between crystal parts in the semiconductor film, and
wherein c-axes of the crystal parts are aligned in a direction parallel to a normal vector of a formation surface or a normal vector of a top surface of the semiconductor film.

17. The semiconductor device according to claim 13 wherein the source electrode and the drain electrode being in contact with the gate insulating film.

18. The semiconductor device according to claim 13, wherein the gate insulating film comprises a silicon oxide film including excess oxygen.

19. The semiconductor device according to claim 18, wherein the silicon oxide film whose spin density attributed to a signal with a g factor of 2.001 in ESR is less than or equal to $3 \times 10^{17}$ spins/cm$^3$.

20. The semiconductor device according to claim 13, wherein the gate insulating film comprises a silicon oxide film including excess oxygen and a silicon nitride film, and
wherein the silicon oxide film is over the silicon nitride film.

21. The semiconductor device according to claim 20, wherein the silicon oxide film whose spin density attributed to a signal with a g factor of 2.001 in ESR is less than or equal to $3 \times 10^{17}$ spins/cm$^3$.

22. An electronic device comprising the semiconductor device according to claim 13.

23. A semiconductor device comprising:
a gate electrode;
a gate insulating film over the gate electrode;
a first oxide semiconductor film overlapping with the gate electrode;
a source electrode and a drain electrode being in contact with the first oxide semiconductor film; and
an oxide film over the first oxide semiconductor film, the source electrode, and the drain electrode,
wherein the gate insulating film is between the first oxide semiconductor film and the gate electrode,
wherein an end portion of the first oxide semiconductor film is spaced from an end portion of the source electrode or the drain electrode in a region overlapping with the first oxide semiconductor film in a channel width direction,
wherein a width of the first oxide semiconductor film in the channel width direction is larger than a width of the source electrode or the drain electrode in the channel width direction,
wherein the first oxide semiconductor film and the oxide film each comprise a metal oxide comprising In, and
wherein a conductivity of the oxide film is lower than a conductivity of the first oxide semiconductor film.

24. The semiconductor device according to claim 23, wherein each of the source electrode and the drain electrode are overlapped with the gate electrode.

* * * * *